US008339217B2

(12) United States Patent
Kawamoto et al.

(10) Patent No.: US 8,339,217 B2
(45) Date of Patent: Dec. 25, 2012

(54) LOW BAND SIDE FILTER OF DUPLEXER, HIGH BAND SIDE FILTER OF DUPLEXER, AND DUPLEXER

(75) Inventors: Toshihiko Kawamoto, Sayama (JP); Susumu Yoshimoto, Sayama (JP)

(73) Assignee: Nihon Dempa Kogyo Co., Ltd., Tokyo ( * ) Notice: Subject to any disclaimer, the term of this patent is extended or adjusted under 35 U.S.C. 154(b) by 253 days.

(21) Appl. No.: 12/660,938

(22) Filed: Mar. 8, 2010

(65) Prior Publication Data

US 2010/0225418 A1 Sep. 9, 2010

(30) Foreign Application Priority Data

Mar. 9, 2009 (JP) .................................. 2009-55381

(51) Int. Cl.
*H03H 9/70* (2006.01)
*H03H 9/72* (2006.01)

(52) U.S. Cl. ........................................ 333/133; 333/193

(58) Field of Classification Search .................. 333/133, 333/193, 194, 195, 196
See application file for complete search history.

(56) References Cited

U.S. PATENT DOCUMENTS

| 5,592,135 | A | 1/1997 | Taguchi et al. | |
|---|---|---|---|---|
| 6,339,365 | B1 * | 1/2002 | Kawase et al. | 333/193 |
| 6,404,303 | B1 * | 6/2002 | Kuroda | 333/193 |
| 6,943,649 | B2 * | 9/2005 | Takeda | 333/193 |
| 8,093,961 | B2 * | 1/2012 | Kawamoto et al. | 333/133 |
| 2002/0158708 | A1 | 10/2002 | Inoue et al. | |
| 2004/0080384 | A1 | 4/2004 | Takeda | |
| 2005/0231306 | A1 | 10/2005 | Kushitani et al. | |
| 2006/0197630 | A1 | 9/2006 | Fuse | |
| 2007/0030094 | A1 | 2/2007 | Omote | |
| 2008/0007370 | A1 | 1/2008 | Matsumoto | |
| 2009/0058557 | A1 | 3/2009 | Tsurunari et al. | |
| 2010/0194488 | A1 * | 8/2010 | Yoshimoto | 333/100 |

FOREIGN PATENT DOCUMENTS

| JP | 7-212183 | 8/1995 |
|---|---|---|
| WO | WO-2005/011114 | 2/2005 |
| WO | WO-2005/101657 | 10/2005 |
| WO | WO-2006/016544 | 2/2006 |
| WO | WO-2007/114390 | 10/2007 |

OTHER PUBLICATIONS

Hao Dong, et al.; "Design of miniaturized rf saw duplexer package", 2003 IEEE Ultrasonics Symposium Proceeding, vol. 1, Oct. 5-8, 2003, pp. 807-810, XP010702242.
Liu Iuling, et al.; "SAW antenna duplexer for trunking communication", Ultrasonics Symposium, 2004 IEEE, vol. 2, Aug. 23-27, 2004, pp. 1521-1524, XP010784252.

* cited by examiner

*Primary Examiner* — Dean O Takaoka
(74) *Attorney, Agent, or Firm* — Jordan and Hamburg LLP

(57) ABSTRACT

A duplexer formed on a piezoelectric substrate includes a low band side filter and a high band side filter, and has an improved isolation characteristic in a pass frequency band of the high band side filter. Transmission and reception of signals are respectively performed from either of the low band side filter and the high band side filter and the other filter with respect to an input/output port. Series arms and parallel arms each formed of an elastic wave resonator form the low band side filter. A shield electrode is disposed close to either of the input/output port and a low band side filter port, and is grounded for capacitive coupling with same.

15 Claims, 27 Drawing Sheets

Fig. 14
(a)
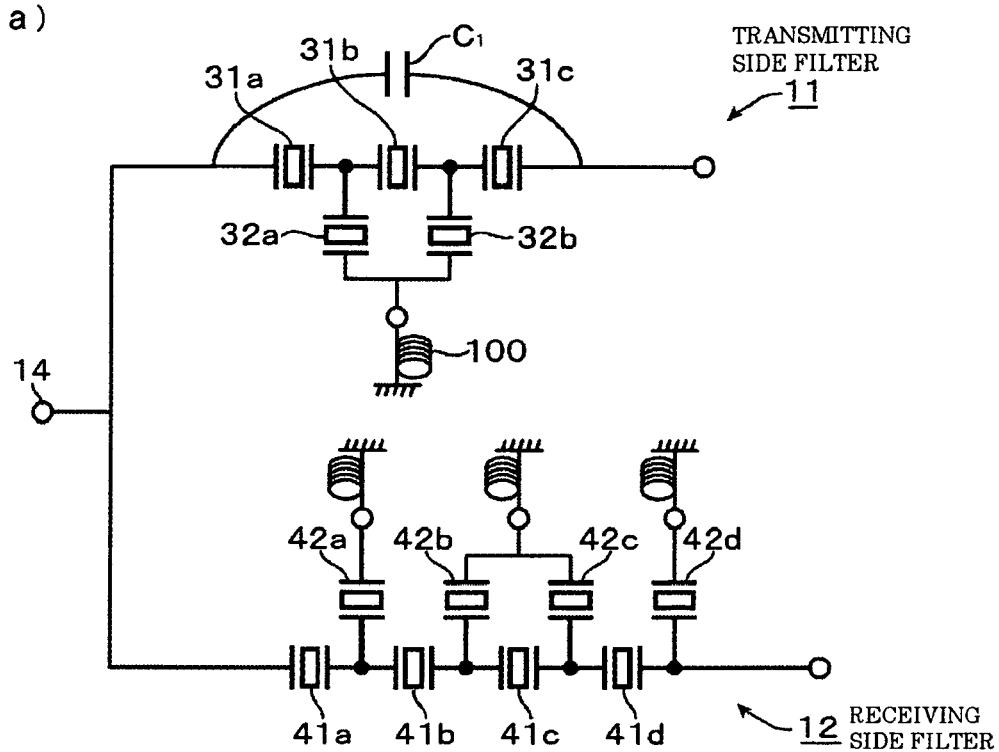
(b)
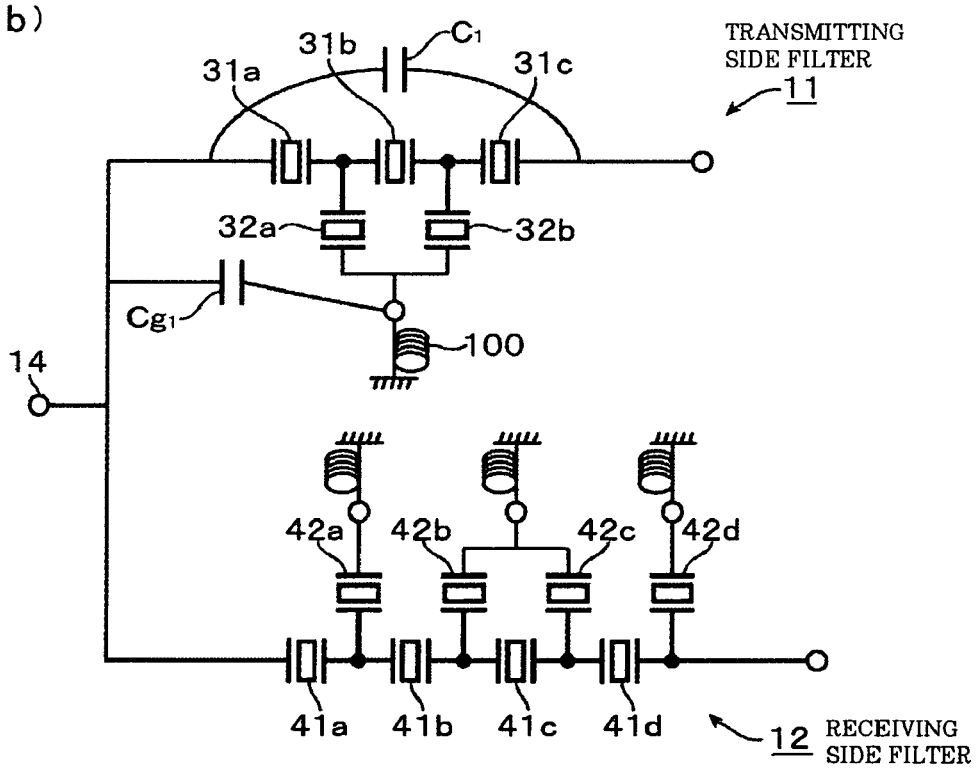

Fig. 21
(a)
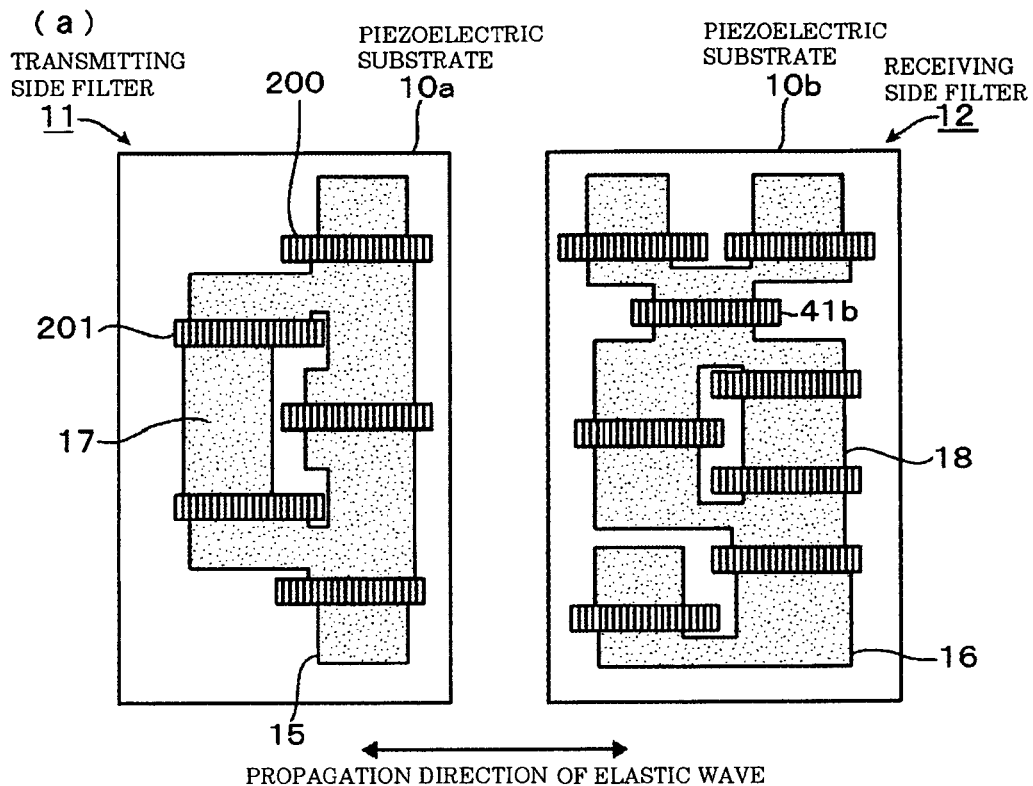
PROPAGATION DIRECTION OF ELASTIC WAVE
(b)
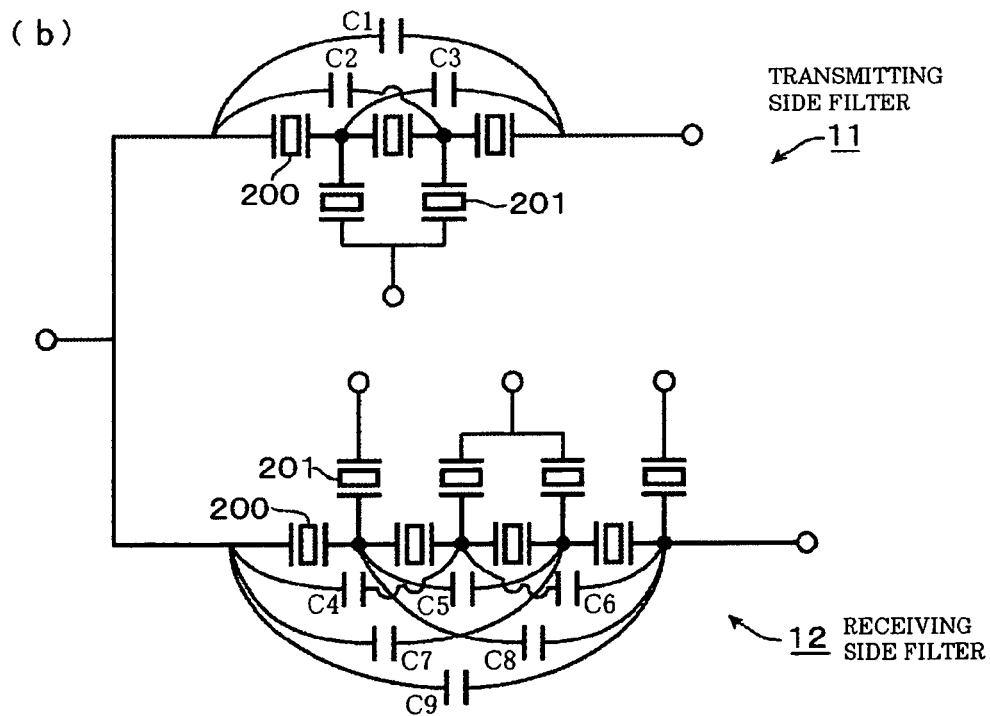

Fig. 22
(a)
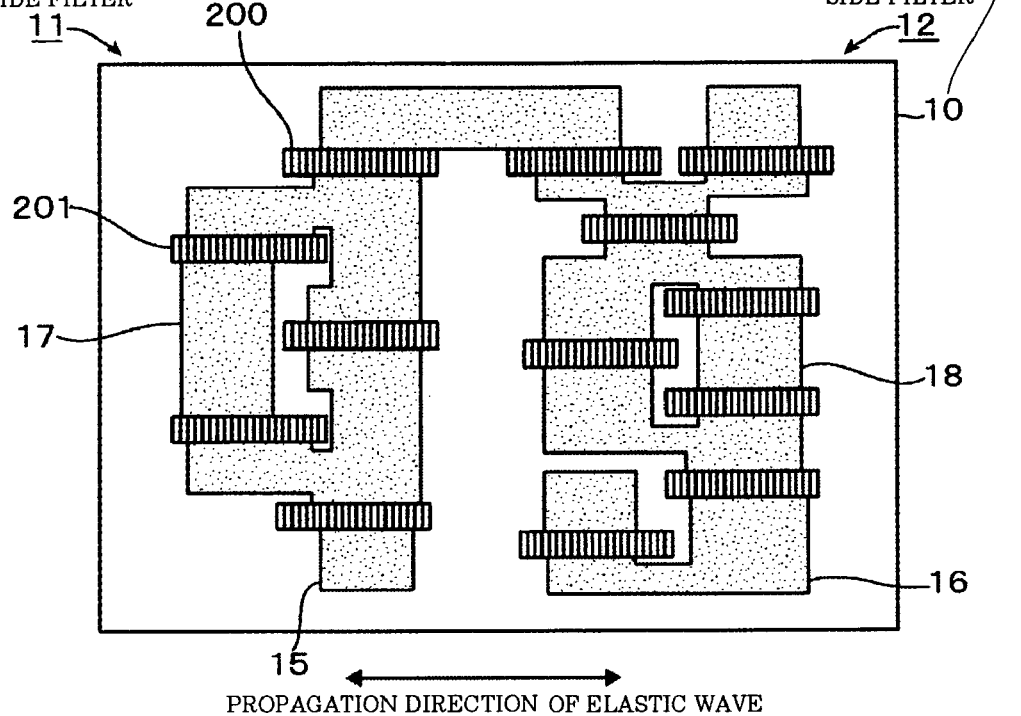
(b)
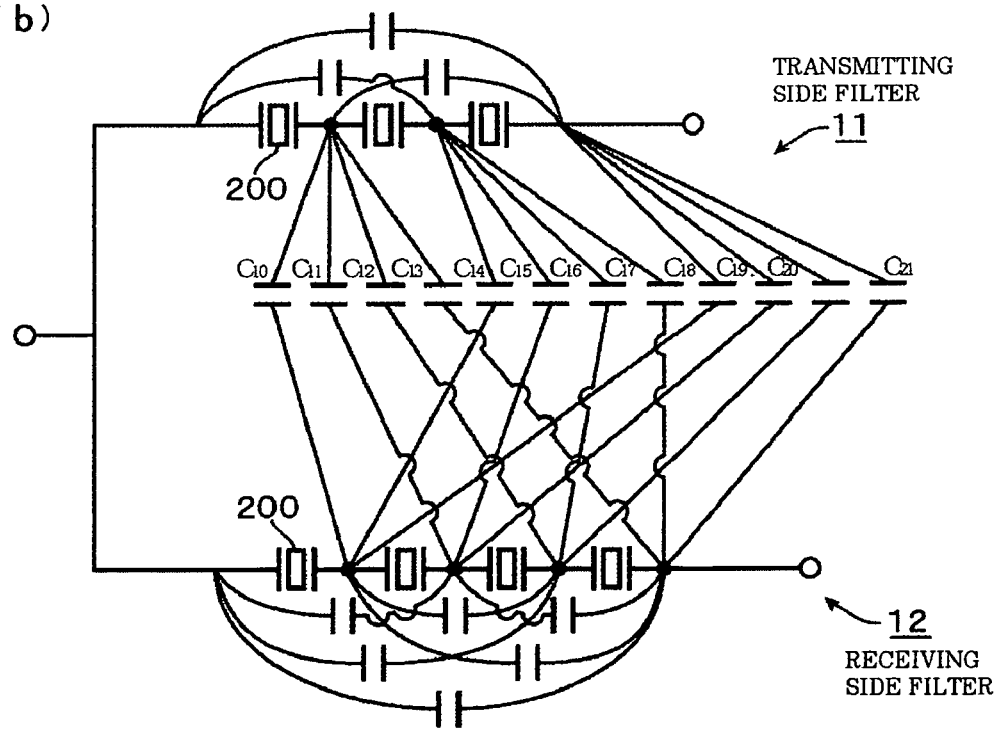

LOW BAND SIDE FILTER OF DUPLEXER, HIGH BAND SIDE FILTER OF DUPLEXER, AND DUPLEXER

BACKGROUND OF THE INVENTION

1. Field of the Invention

The present invention relates to a duplexer used in, for example, a portable terminal device and the like.

2. Description of the Related Art

In a device having a two-way radio communication function such as a mobile phone, and a radio communication system using this type of device as a communication terminal, in order to transmit/receive signals using one common antenna provided in the communication terminal, a transmission signal and a reception signal are separated in a duplexer (elastic wave duplexer) including a transmitting side filter and a receiving side filter by providing a difference between a frequency of transmission signal and a frequency of reception signal, and reducing a level of signal flowing between the transmitting side filter and the receiving side filter to realize a preferable isolation characteristic, as shown in FIG. 20.

Concretely, the duplexer includes, as shown in FIG. 21(a), for instance, a low band (transmitting) side filter 11 for transmitting a transmission signal from a transmission input port 15 to a not-shown antenna port, and a high band (receiving) side filter 12 for receiving a reception signal at a reception output port 16 via the antenna port. The respective filters 11, 12 are formed of ladder-type filters each formed of SAW (Surface Acoustic Wave) resonators 200 being series arms and SAW resonators 201 being parallel arms, and are formed on mutually different piezoelectric substrates 10a, 10b, for instance. Reference numerals 17, 18 in FIG. 21(a) denote ground electrodes. Note that in the duplexer, a not-shown phase shifter is provided to prevent the reception signal from entering the transmitting side filter 11.

When the transmission/reception of signals is conducted in the duplexer, in each of the filters 11, 12, capacitive couplings C1 to C3 and C4 to C9 are respectively formed so as to stride over the plurality of SAW resonators 200, 201 via an upper area or an internal area of the piezoelectric substrate 10, for instance, as shown in FIG. 21(b). Accordingly, due to the capacitive couplings C1 to C3 formed in the transmitting side filter 11, for instance, the isolation characteristic in a pass frequency band of the receiving side filter 12 is deteriorated, as also shown in later-described FIG. 4.

Further, as shown in FIG. 22(a), for instance, when the filters 11, 12 are formed on one piezoelectric substrate 10 to miniaturize the duplexer, the filters 11, 12 are disposed close to each other. Accordingly, as shown in FIG. 22(b), an influence of capacitive couplings C10 to C21 generated between the filters 11 and 12 becomes large in addition to that of the aforementioned capacitive couplings C1 to C9, which further deteriorates the isolation characteristic in the pass frequency band of the receiving side filter 12. Note that in FIG. 22(b), the illustration of parallel arms (SAW resonators) 201 is omitted.

In addition, the conventional duplexer also has problems as follows. Specifically, a frequency signal with double the pass band of the receiving side filter 12 (double frequency signal) becomes a main cause of increasing a harmonic signal level in a device on a rear stage side of the receiving side filter 12, so that there is a request to increase an attenuation in the double frequency. For this reason, there is required a function for adjusting a position of maximum attenuation 3 that is generated on a high band side of the pass band of the receiving side filter 12, which is, for instance, in the vicinity of 1500 MHz, as shown in FIG. 23. For example, as a method of shifting the position of the maximum attenuation 3 to the low band side, there is known a method of adjusting a length and the like of routed electrodes and bonding wires on a package side connected to ground electrodes 17, 18, or electrodes connected to these ground electrodes 17, 18 at an external of the device, for example, to thereby increase inductance components of these electrodes. However, in the above method, there is a need to fabricate a package in accordance with the device connected to the rear stage side of the duplexer, for example, so that time and cost have to be spent for fabricating the packages, and further, when the ground electrodes 17, 18 are grounded using bumps, it is difficult to increase inductance components of the bumps. Further, as a method of shifting the position of the maximum attenuation 3 to the low band side, there is also known a method of increasing capacitances of the parallel arms 201 and decreasing capacitances of the series arms 200, but, with these methods, an insertion loss in the pass frequency band of the filters 11, 12 becomes large.

Although Patent Document 1 discloses a technique for appropriately setting a bridging capacitor C when improving an attenuation characteristic in a surface wave filter, no description has been made regarding the aforementioned problems. Further, although Patent Document 2 discloses a structure for improving an isolation characteristic in a duplexer, no study has been made on the maximum attenuation 3.

[Patent Document 1] International Publication WO 2005/101657 (paragraphs 0010, 0012, and FIG. 10)

[Patent Document 2] International Publication WO 2006/016544 (FIG. 14)

SUMMARY OF THE INVENTION

The present invention has been made based on such circumstances, and an object thereof is to provide a low band side filter of a duplexer, a high band side filter of a duplexer, and a duplexer capable of improving, in the low band side filter or the high band side filter of the duplexer, an isolation characteristic in a pass frequency band of the high band side filter.

A low band side filter of the present invention being a low band side filter in a duplexer formed on a piezoelectric substrate and in which transmission and reception of signals are respectively performed from either of the low band side filter and a high band side filter and the other filter with respect to an input/output port, the low band side filter is characterized in that it includes: elastic wave resonators provided between the input/output port and a low band side filter port through which either the transmission or the reception of signals is performed with respect to the input/output port; and a first shield electrode closely disposed to at least either of the input/output port and the low band side filter port and grounded to form a capacitive coupling between the electrode and the either of the ports.

As a concrete example, the aforementioned low band side filter can also be structured as follows. The first shield electrode is structured to be disposed in an area between the low band side filter and the high band side filter. The first shield electrode is structured to be connected to a first ground electrode provided in the low band side filter. The first shield electrode is structured to have an elastic wave resonator interposed therein. The low band side filter is structured to be formed as a transmitting side filter having elastic wave resonators that form series arms and elastic wave resonators that form parallel arms.

A high band side filter of the present invention being a high band side filter in a duplexer formed on a piezoelectric substrate and in which transmission and reception of signals are respectively performed from either of a low band side filter and the high band side filter and the other filter with respect to an input/output port, the high band side filter is characterized in that it includes: elastic wave resonators provided between the input/output port and a high band side filter port through which either the transmission or the reception of signals is performed with respect to the input/output port; and a second shield electrode formed on an area opposite to the low band side filter, closely disposed to at least either of the input/output port and a low band side filter port of the low band side filter and grounded to form a capacitive coupling between the electrode and the either of the ports.

As a concrete example, the aforementioned high band side filter can also be structured as follows. The second shield electrode is structured to be connected to a second ground electrode provided in the high band side filter. The second shield electrode is structured to have an elastic wave resonator interposed therein. The high band side filter is structured to be formed as a receiving side filter having either of a filter having elastic wave resonators that form series arms and elastic wave resonators that form parallel arms, and a longitudinal mode resonator type filter.

A duplexer of the present invention being a duplexer having a low band side filter and a high band side filter each formed on a piezoelectric substrate and in which transmission and reception of signals are respectively performed from either of the low band side filter and the high band side filter and the other filter with respect to an input/output port, the duplexer is characterized in that it includes at least either of the aforementioned low band side filter and the aforementioned high band side filter. The low band side filter and the high band side filter may also be formed on the same piezoelectric substrate.

According to the present invention, in a low band side filter or a high band side filter in a duplexer in which transmission and reception of signals are respectively performed from either of the low band side filter and the high band side filter and the other filter with respect to an input/output port, there is disposed a shield electrode closely disposed to at least either of the input/output port and a low band side filter port of the low band side filter and grounded to form a capacitive coupling between the electrode and the either of the ports. Accordingly, it is possible to reduce capacitive couplings generated between, for instance, the input/output port and a transmission input port and the like, to a low level, which enables to obtain a preferable isolation characteristic in a pass frequency band of the high band side filter. Further, since the capacitive coupling is generated between the shield electrode and at least either of the input/output port and the low band side filter port to which the shield electrode is closely disposed, it is possible to shift a position of maximum attenuation that is generated on a high band side of the pass frequency band of the low band side filter and the high band side filter, to the low band side, as will be seen also from later-described simulation results.

BRIEF DESCRIPTION OF THE DRAWINGS

FIGS. 14(a) and 14(b) are characteristic diagrams showing results obtained in an example of the present invention;

FIGS. 21(a) and 21(b) are schematic views showing a conventional duplexer;

FIGS. 22(a) and 22(b) are schematic views showing a conventional duplexer; and

DETAILED DESCRIPTION OF THE PREFERRED EMBODIMENT(S)

Figure 1:
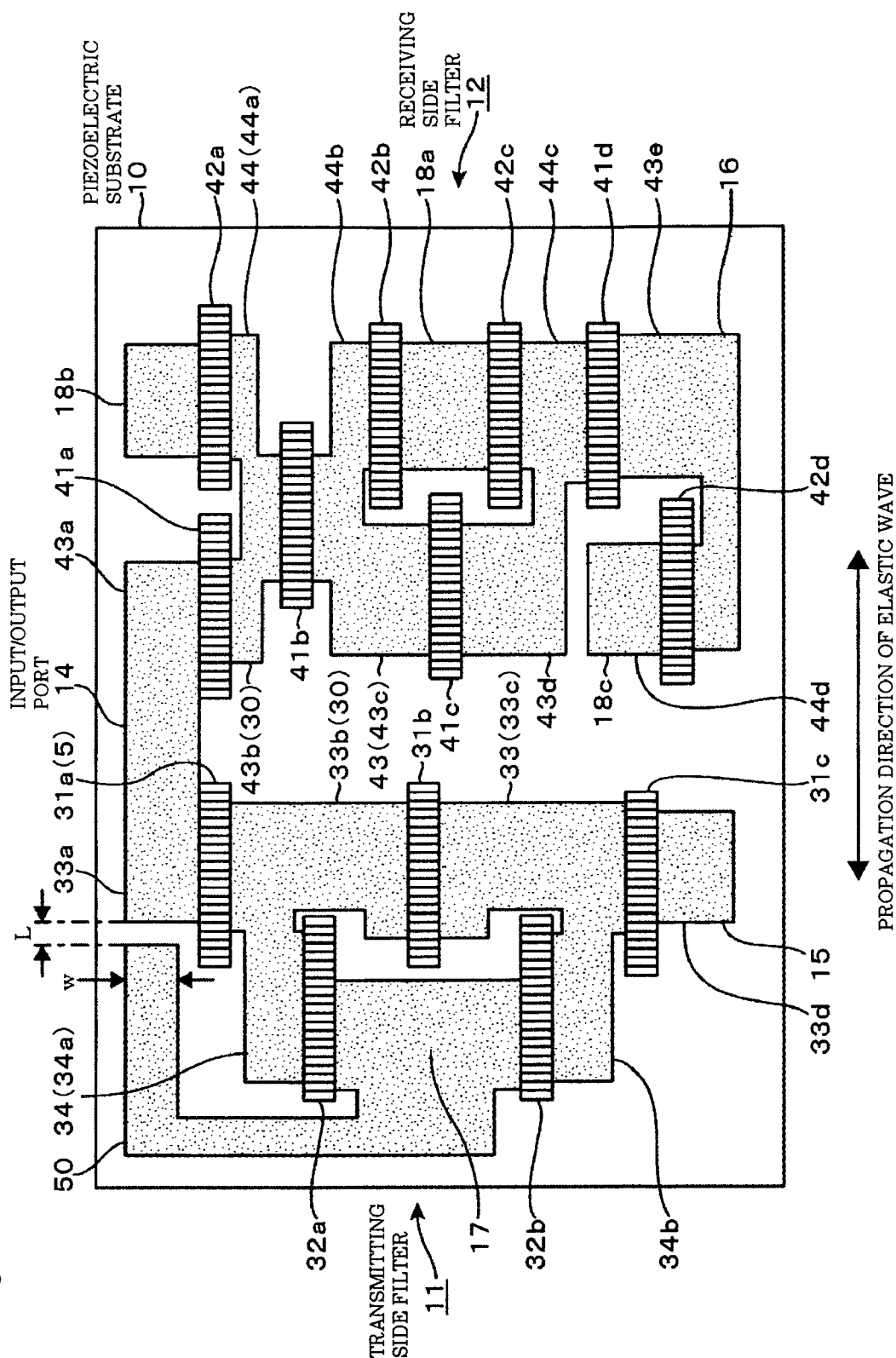
FIG. 1 is a plan view showing a structure example of a duplexer according to an embodiment of the present invention.

An explanation on a duplexer (elastic wave duplexer) being an embodiment of the present invention will be made with reference to FIG. 1. The duplexer is formed on a piezoelectric substrate 10 formed of a piezoelectric material of, for instance, lithium tantalite (LiTaO3), lithium niobate (LiNbO3), or quartz crystal, and includes a common input/output port 14 through which transmission/reception of signals is conducted, a transmitting (low band) side filter 11 being a transmission circuit that transmits signals to the input/output port 14, and a receiving (high band) side filter 12 being a reception circuit that receives the signals via the input/output port 14. Further, the input/output port 14 and the filters 11, 12 are connected to one another via a signal path 30. These filters 11, 12 are disposed on the left side and on the right side in a propagation direction of the elastic wave (horizontal direction in FIG. 1), respectively. Note that the filters 11, 12, and the like are denoted by hatching, for easier discrimination.

The duplexer is formed by, for instance, forming a metal film made of, for example, aluminum on an entire surface of the piezoelectric substrate 10, and subsequently performing, for example, etching on the filters 11, 12 and the metal film of an area around a later-described shield electrode 50 using photolithography. Therefore, the filters 11, 12 and the shield electrode 50 have the same film thickness of about 0.1 to 1 μm, for instance.

Next, the transmitting side filter 11 of the present invention will be described. The transmitting side filter 11 is a filter for filtering a transmission signal having a center frequency of 836.5 MHz, for example, and transmitting the signal from a not-shown transmission processing part in the device to the input/output port 14, and is formed of a filter in which SAW (Surface Acoustic Wave) resonators (elastic wave resonators) 5 are connected in a ladder form.

Although the SAW resonator 5 is schematically shown in FIG. 1, the SAW resonator 5 is formed of an IDT (interdigital transducer) electrode being a cross finger electrode and two reflectors disposed on both sides of the IDT electrode (either of which is not shown) along the propagation direction of the elastic wave.

Hereinafter, a concrete disposition layout of the SAW resonators 5 in the transmitting side filter 11 will be described in detail. In the transmitting side filter 11, a plurality of, for example, three series arms 31a to 31c each formed of the SAW resonator 5 are disposed in this order from the rearward input/output port 14 side toward the forward side, and these series arms 31a to 31c are serially connected via a serial signal path 33 at positions close to the receiving side filter 12. Further, the serial signal path 33 extends to the front side of the series arm 31c to form a transmission input port (low band side filter port) 15 to which a signal is input from the not-shown transmission processing part.

Here, regarding the serial signal path 33 connecting these series arms 31a to 31c, if signal paths on the input/output port 14 side of the series arm 31a, between the series arm 31a and the series arm 31b, between the series arm 31b and the series arm 31c, and on the transmission input port 15 side of the series arm 31c, from the rearward side toward the forward side, are supposed to be called as serial signal paths 33a to 33d, respectively, one end sides of parallel signal paths 34a, 34b extending to an end area of the piezoelectric substrate 10 are connected to the serial signal path 33b and the serial signal path 33c, respectively. Further, to the other end sides of the parallel signal paths 34a, 34b, parallel arms 32a, 32b each formed of the SAW resonator 5 are interposed, and the other end sides are connected by being bent in an L-shape so as to oppose to each other. A connected portion of the parallel signal paths 34a, 34b forms a first ground electrode 17 and grounded by being connected to a ground port formed on a module substrate (either of which is not shown) on which the piezoelectric substrate 10 is mounted using, for instance, bonding wires, bumps, or the like.

To the first ground electrode 17, there is connected a first shield electrode 50 formed in a substantially L-shape so as to close to the aforementioned input/output port 14 from a lateral side thereof by extending to a lateral side from the first ground electrode 17 to an end area in a longitudinal direction of the piezoelectric substrate 10 (propagation direction of the elastic wave) and surrounding a lateral position and the rearward side of the transmitting side filter 11. If a separation size L between the first shield electrode 50 and the input/output port 14 is too small, an insertion loss in a band becomes large, and if it is too large, an improvement effect of the isolation characteristic becomes small, so that the size is set to 10 to 100 μm, preferably to 50 μm, for instance. Further, a width size W of the first shield electrode 50 close to the input/output port 14 is set to, for instance, 100 μm.

Next, the receiving side filter 12 will be described. The receiving side filter 12 is a filter for filtering (selecting a frequency of) a reception signal having a frequency of 881.5 MHz, for example, and outputting the signal to a not-shown reception processing part in the device, and in this example, it is formed of a ladder-type filter in which the SAW resonators 5 are connected in a serial and parallel manner by a serial signal path 43 and a parallel signal path 44, similar to the transmitting side filter 11. In this embodiment, the receiving side filter 12 is formed as a T-type eight-stage filter in which a plurality of, for example, four series arms 41 and four parallel arms 42 are connected via the serial signal path 43 and the parallel signal path 44.

Also in this receiving side filter 12, similar to the transmitting side filter 11, the series arms 41 and the parallel arms 42 are supposed to be called as series arms 41a to 41d and parallel arms 42a to 42d, respectively, from the rearward side toward the forward side, and the serial signal path 43 and the parallel signal path 44 are also set as serial signal paths 43a to 43e and parallel signal paths 44a to 44d, respectively, from the rearward side toward the forward side. One end sides of the parallel signal paths 44b, 44c are respectively connected to the serial signal paths 43c, 43d, the other end sides thereof are mutually connected by being bent in an L-shape via the parallel arms 42b, 42c, respectively, and the connected portion forms a ground electrode 18a. Further, one end sides of the parallel signal paths 44a, 44d are respectively connected to the serial signal paths 43b, 43e, and the other end sides thereof extend via the respective parallel arms 42a, 42d to form ground electrodes 18b, 18c, respectively. Either one of the ground electrodes 18a to 18c forms a second ground electrode, and each of the electrodes is connected a ground port formed on the module substrate (each of which is not shown) via bonding wires, bumps, or the like. Further, the serial signal path 43e forms a reception output port 16 through which the signal received at the input/output port 14 is output to the not-shown reception processing part via the receiving side filter 12. Note that between the receiving side filter 12 and the input/output port 14, a not-shown phase shifter is interposed to prevent the signal transmitted from the transmitting side filter 11 to the input/output port 14 from entering the receiving side filter 12. Further, as the receiving side filter 12, a longitudinal mode resonator type filter that converts unbalanced signals into balanced signals may also be used, for instance.

Next, an operation of the aforementioned embodiment will be described. A signal for transmission is sent from the transmission input port 15 to the input/output port 14 via the transmitting side filter 11, and is transmitted from a not-shown antenna. Meanwhile, a signal received by the antenna passes through the input/output port 14 and the not-shown phase shifter, output to the reception output port 16 via the receiving side filter 12, and is sent to a not-shown signal processing part.

Figure 2:
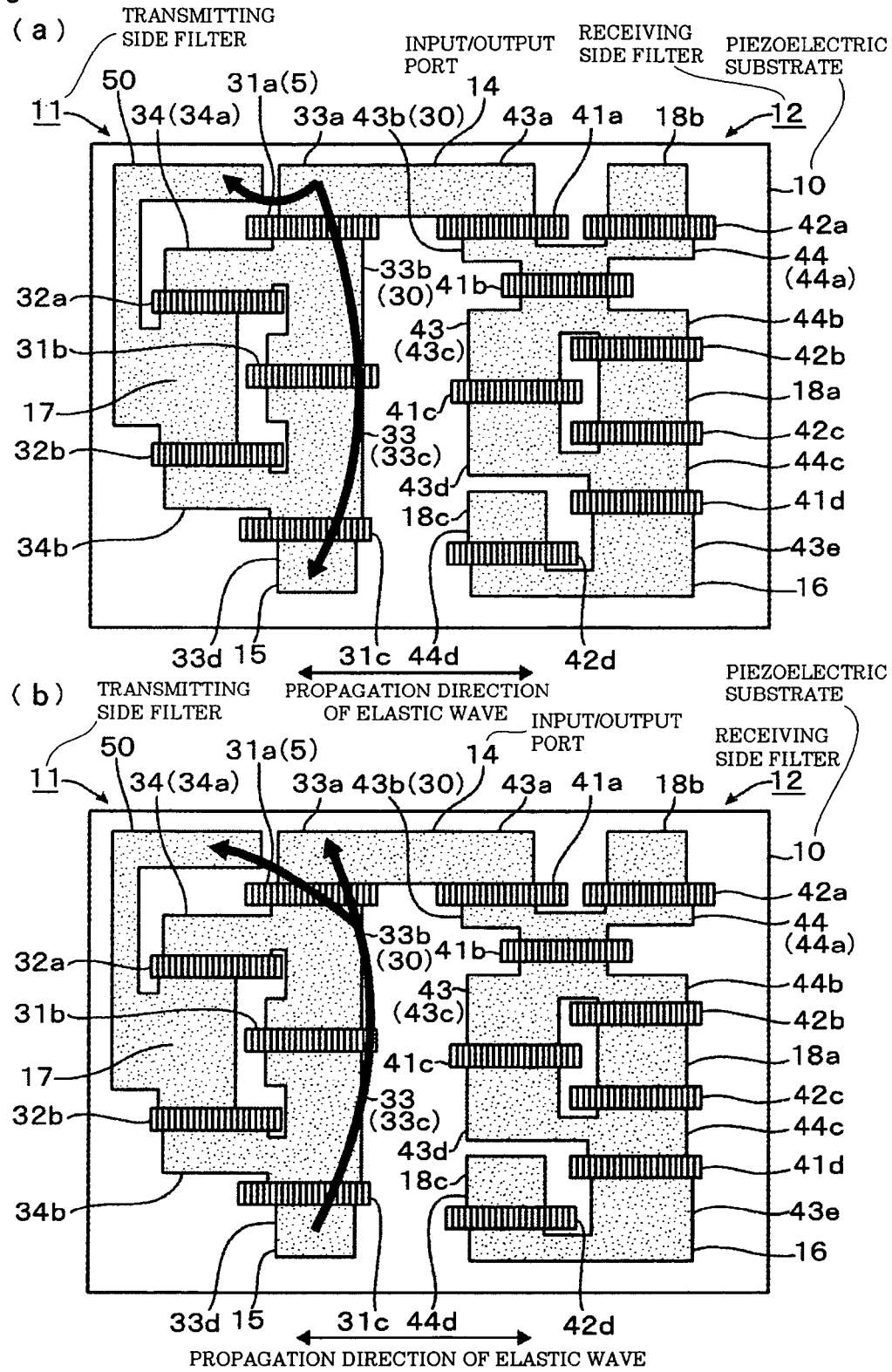
FIGS. 2(a) and 2(b) are schematic views schematically showing an operation in the aforementioned duplexer.
Figure 4:
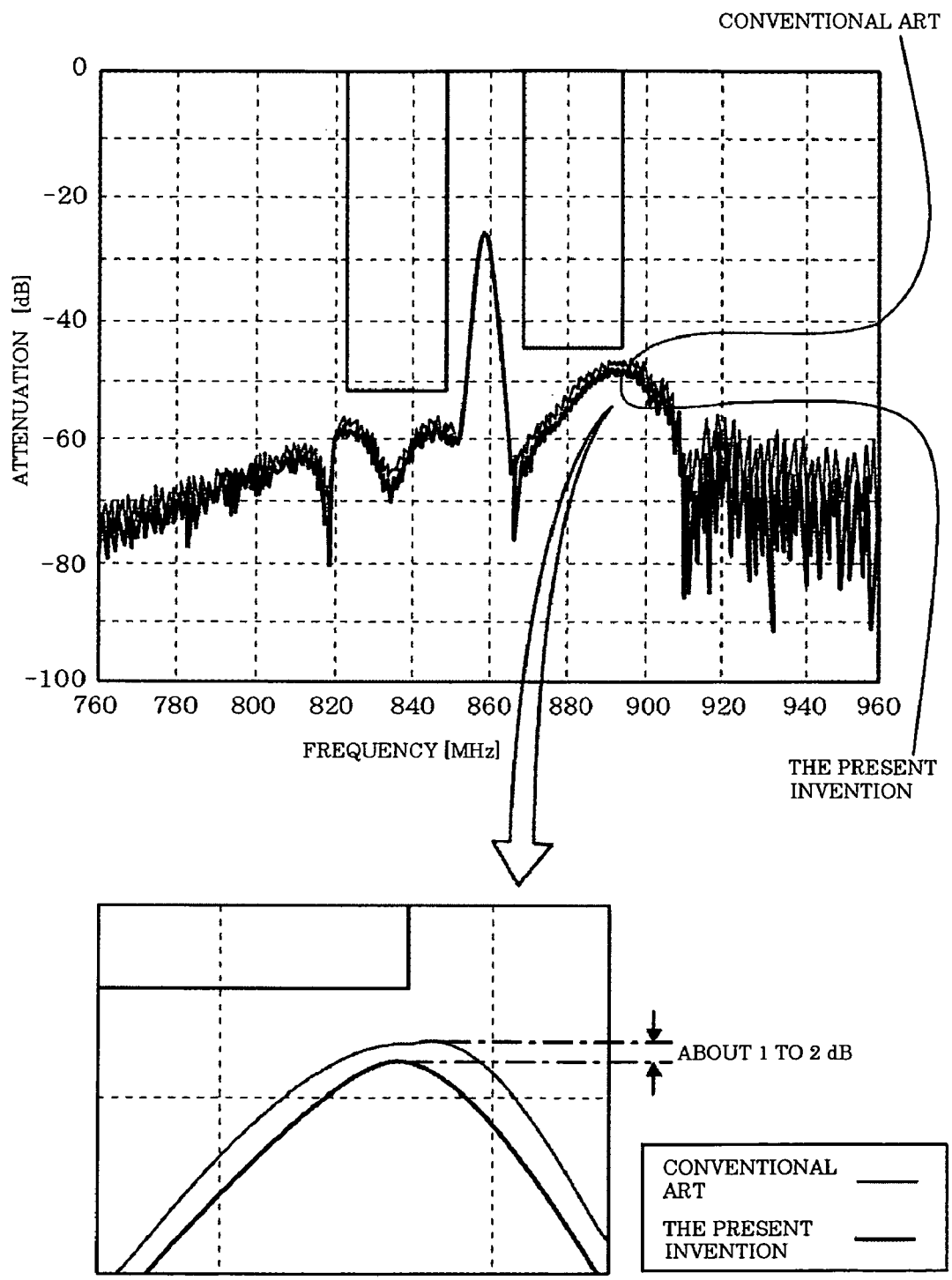
FIG. 4 is a characteristic diagram showing an isolation characteristic obtained by the aforementioned duplexer.

At this time, in the serial signal paths 33a to 33d in the transmitting side filter 11, for instance, when the first shield electrode 50 is not disposed, capacitive couplings C1 to C3 are formed between the serial signal paths 33a and 33d, between the serial signal paths 33a and 33c, and between the serial signal paths 33b and 33d, respectively, so as to stride over the plurality of series arms 31a to 31d via an upper area or an internal area of the piezoelectric substrate 10, for instance, as shown in the aforementioned FIG. 21(b). However, since an end position of the first shield electrode 50 is arranged close to a lateral side of the input/output port 14 as described above, the capacitive coupling C1 formed between the input/output port 14 (serial signal path 33a) and the serial signal path 33d (transmission input port 15), for instance, is partially absorbed by the first shield electrode 50, namely, partially grounded by the first shield electrode 50, which results in reducing the capacitive coupling C1 to a low level, as shown in FIGS. 2(a) and 2(b). Accordingly, the isolation characteristic in the pass frequency band of the receiving side filter 12 is more improved than the conventional examples shown in the aforementioned FIG. 21 and FIG. 22. An isolation characteristic actually obtained in the duplexer is shown in FIG. 4, from which it can be seen that the isolation characteristic on the high band side is improved by about 1 to 2 dB, compared with the conventional duplexer. Therefore, to "closely dispose" the first shield electrode 50 and the input/output port 14 described in the claims is to closely dispose them to the extent that the isolation characteristic on the high band side is improved as above, namely, to set the separation size L as described above. Note that only the capacitive coupling C1 is illustrated in FIG. 2, but, actually, the capacitive couplings C2, C3 are also reduced to a low level in the same manner.

Figure 3:
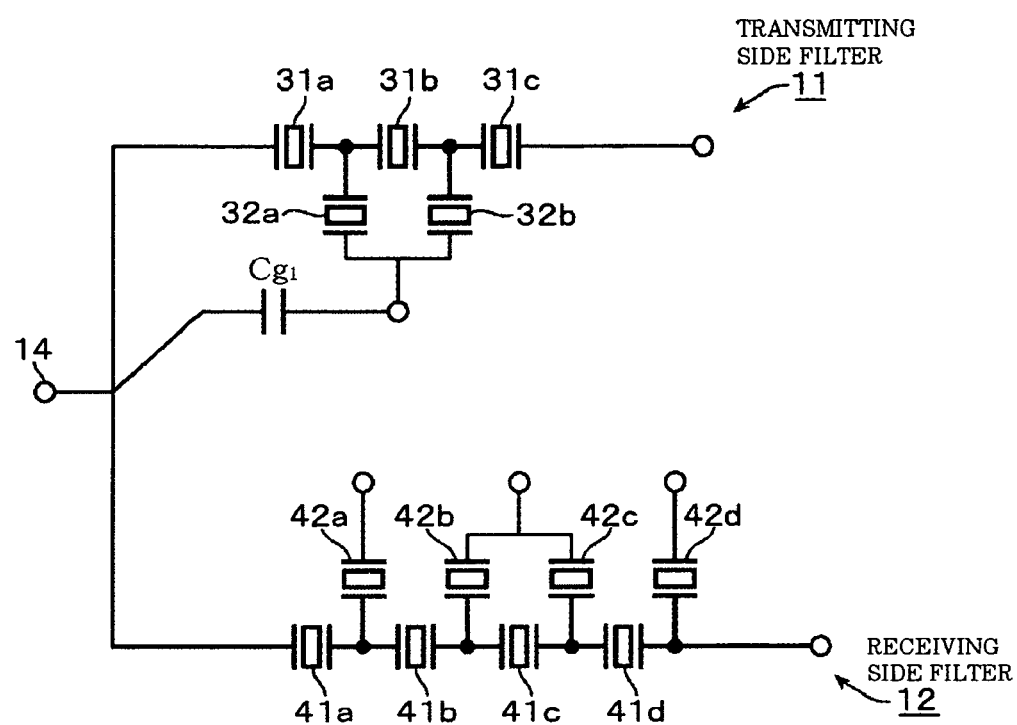
FIG. 3 is a schematic view showing an example of an electric circuit formed of the aforementioned duplexer.
Figure 5:
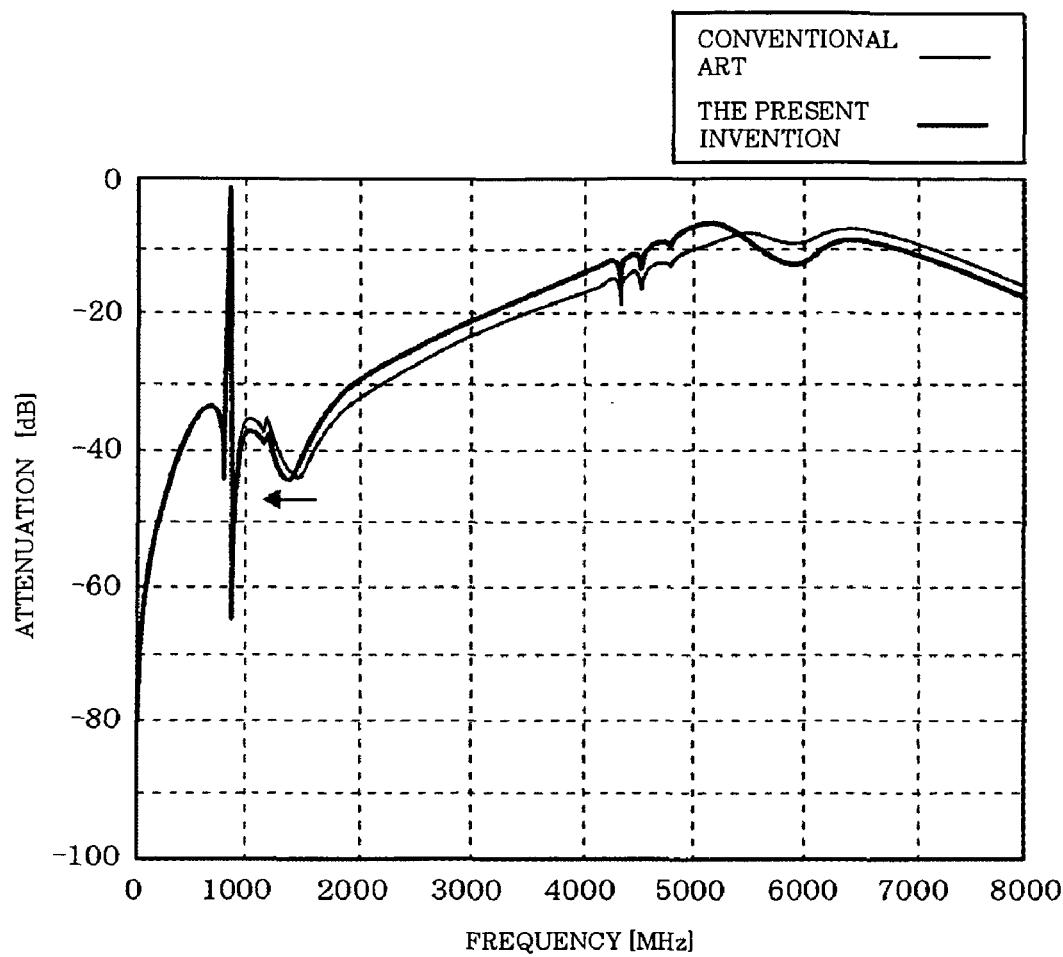
FIG. 5 is a characteristic diagram showing a frequency characteristic obtained by the aforementioned duplexer.
Figure 23:
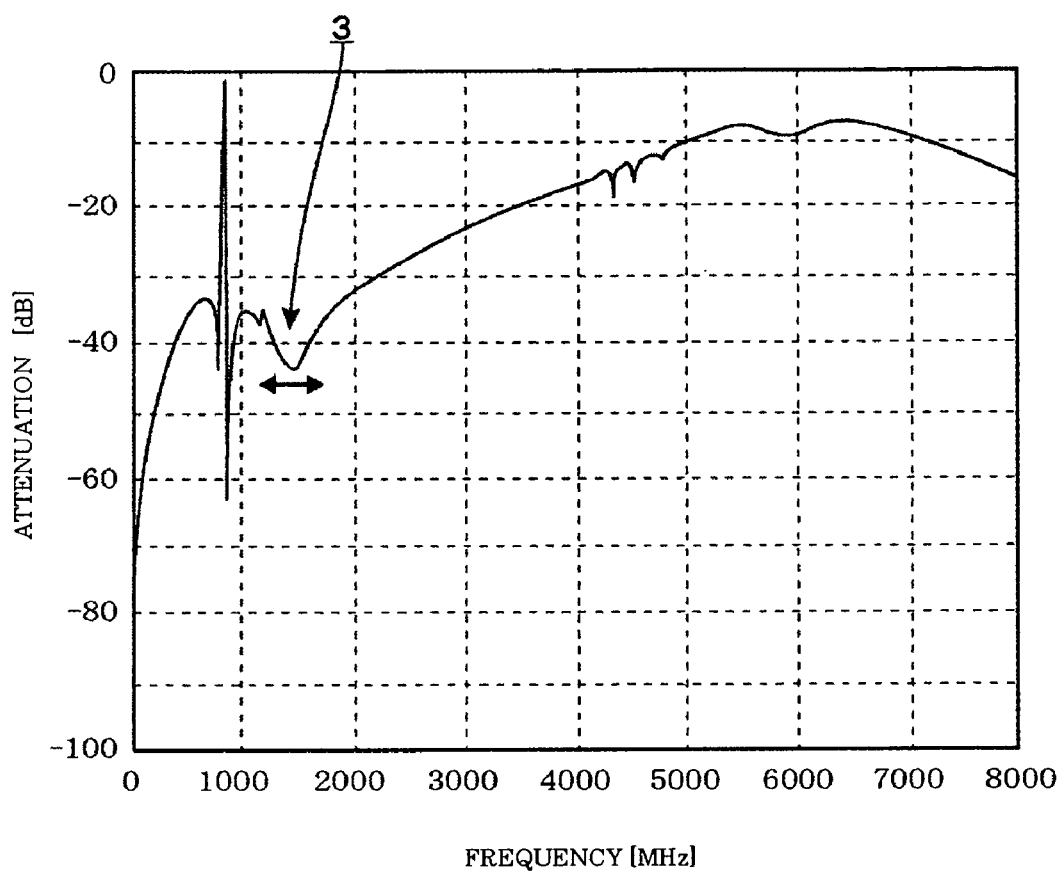
FIG. 23 is a schematic view schematically showing a characteristic obtained by a conventional duplexer.

Further, since the end position of the first shield electrode 50 is approximated to the input/output port 14, a capacitive coupling Cg1 is formed between the first shield electrode 50 and the input/output port 14, as shown in FIG. 3. Accordingly, the maximum attenuation 3 shown in the aforementioned FIG. 23 is shifted to the low band side in accordance with a magnitude of the capacitive coupling Cg1. A characteristic actually obtained regarding the maximum attenuation 3 is shown in FIG. 5, from which it can be seen that the maximum attenuation is shifted by about 100 MHz from 1447 MHz to 1338 MHz, compared with the conventional duplexer. Further, as a method of shifting the maximum attenuation 3 to the high band side, there can be used a conventionally known method such as, for example, a method of increasing a capacitance of series resonator, a method of decreasing a capacitance of parallel resonator, and a method of reducing an inductance component of a package and a wire connected to the parallel resonator, so that by combining the method and a method of adjusting the magnitude of the aforementioned capacitive coupling Cg1, namely, the separation size L between the first shield electrode 50 and the input/output port 14, it is possible to shift the position of the maximum attenuation 3 to an arbitrary position in a range of, for example, about −500 MHz to +500 MHz. Therefore, it is possible to reduce a harmonic signal level in a device connected to a rear stage side of the duplexer to a low level.

According to the aforementioned embodiment, the plurality of SAW resonators 5 are connected in a serial and parallel manner by the serial signal path 33 and the parallel signal path 34 to form the transmitting side filter 11, and the first shield electrode 50 is disposed to extend from the first ground electrode 17 formed on an end portion of the parallel signal path 34 to the position close to the input/output port 14 so that the capacitive coupling Cg1 is formed between the electrode and input/output port 14. Therefore, it is possible to reduce the capacitive couplings C1 to C3 generated between, for instance, the serial signal paths 33 between the input/output port 14 and the transmission input port 15 to a low level, so that in the duplexer including this transmitting side filter 11, a preferable isolation characteristic can be obtained in the pass frequency band of the receiving side filter 12.

Further, since the capacitive coupling Cg1 is generated between the first shield electrode 50 and the input/output port 14 to which the first shield electrode 50 is closely disposed, it is possible to shift the position of the maximum attenuation 3 generated on a high band side of the pass frequency band of the transmitting side filter 11 and the receiving side filter 12, to the low band side, as can be seen also from the aforementioned experimental result in FIG. 5 and the later-described simulation results. Accordingly, by combining the conventionally known method for shifting the position of the maximum attenuation 3 to the high band side and the adjustment of magnitude of the capacitive coupling Cg1, the position of the maximum attenuation 3 can be freely shifted, so that it is possible to reduce the harmonic signal level to a low level in a device on a rear stage side of the duplexer, for instance. Therefore, the necessity for fabricating a package for each type of the devices connected to the rear stage of the duplexer is eliminated, and it is possible to deal with various types of devices on the rear stage only by changing the duplexer (transmitting side filter 11), which enables to reduce time and cost required to fabricate the packages.

At this time, by using the first shield electrode 50, it is possible to improve the isolation characteristic and to shift the maximum attenuation 3 as described above while reducing the insertion loss in the pass frequency band to a low level, as can be seen also from the later-described simulation results.

Figure 6:
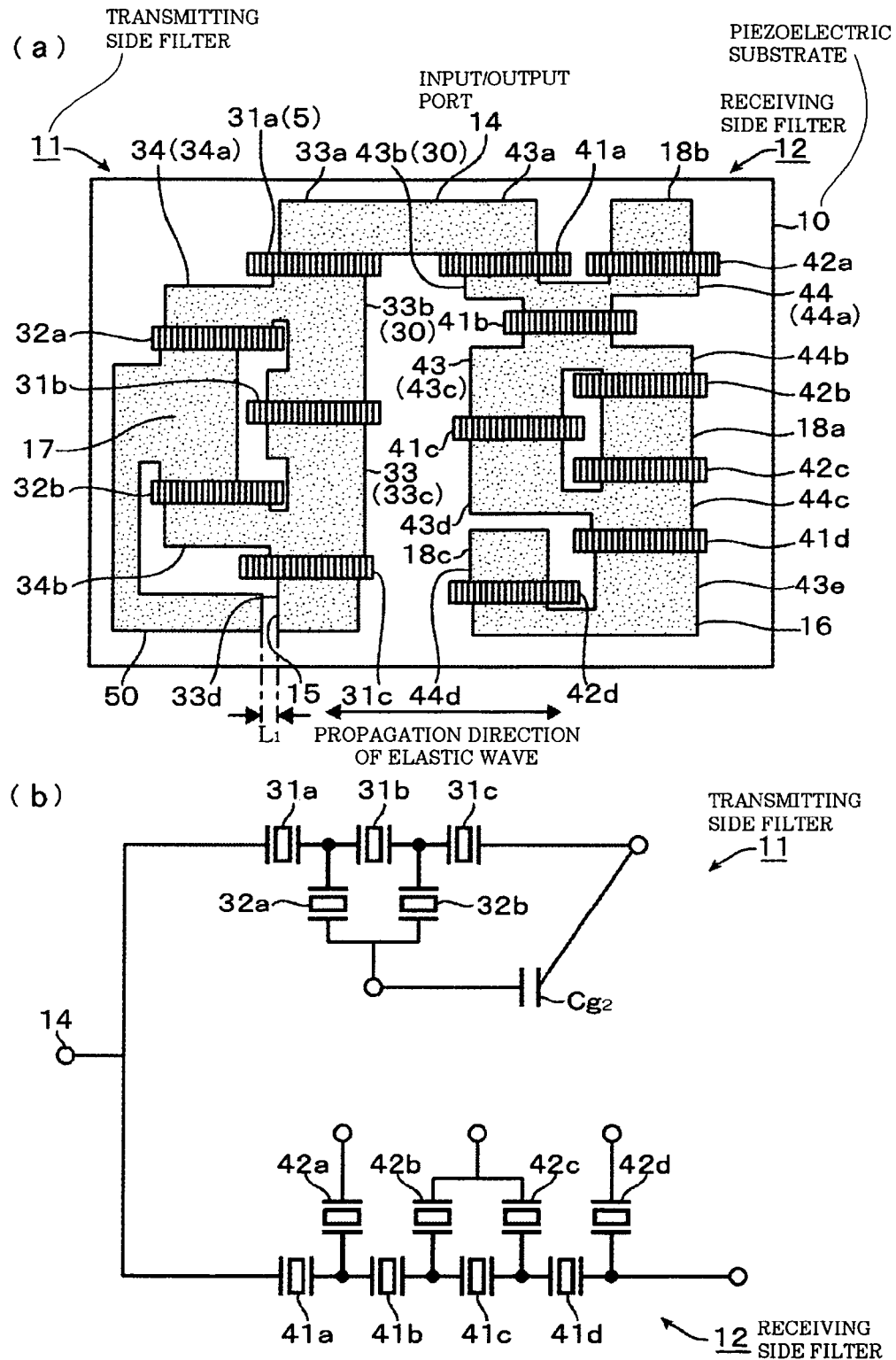
FIGS. 6(a) and 6(b) are schematic views schematically showing an another example of the aforementioned duplexer.

In the above example, the first shield electrode 50 is disposed close to the input/output port 14 from the first ground electrode 17, but, it is also possible to dispose the electrode close to the transmission input port 15 from the first ground electrode 17, as shown in FIG. 6(a), for instance. If a separation size between the first shield electrode 50 and the transmission input port 15 is set as L1, the separation size L1 is set to 10 to 100 µm, preferably to 50 µm, for instance. Also in this case, the capacitive couplings C1 to C3 are reduced to a low level in the same manner, and a capacitive coupling Cg2 is formed between the first shield electrode 50 and the transmission input port 15 as shown in FIG. 6(b), so that the maximum attenuation 3 is similarly shifted to the low band side because of the capacitive coupling Cg2.

Figure 7:
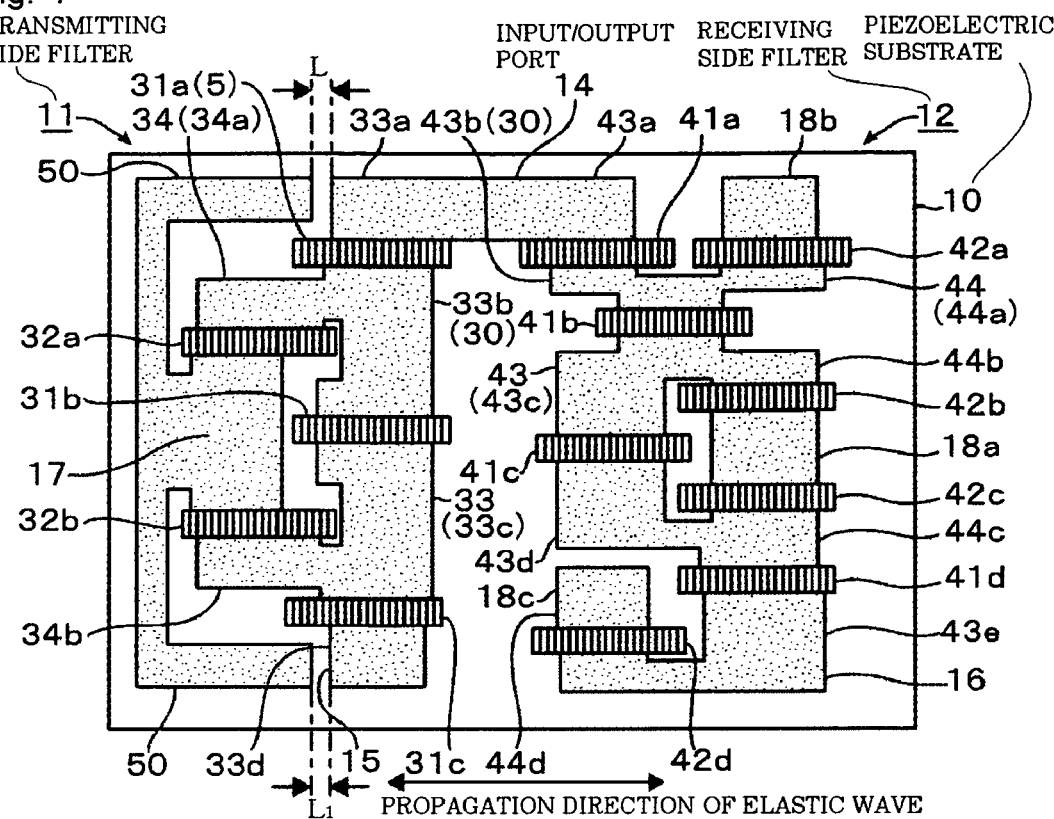
FIG. 7 is a plan view schematically showing an another example of the aforementioned duplexer.

Further, as shown in FIG. 7, it is also possible to dispose the first shield electrode 50 close to both the input/output port 14 and the transmission input port 15. Also at this time, the aforementioned separation sizes L, L1 are adjusted to the same sizes as those in the aforementioned example. In this case, the capacitive couplings C1 to C3 are further reduced to a low level, so that the isolation characteristic is further improved. Further, the maximum attenuation 3 is also shifted further to the low band side because of Cg1, Cg2.

Figure 8:
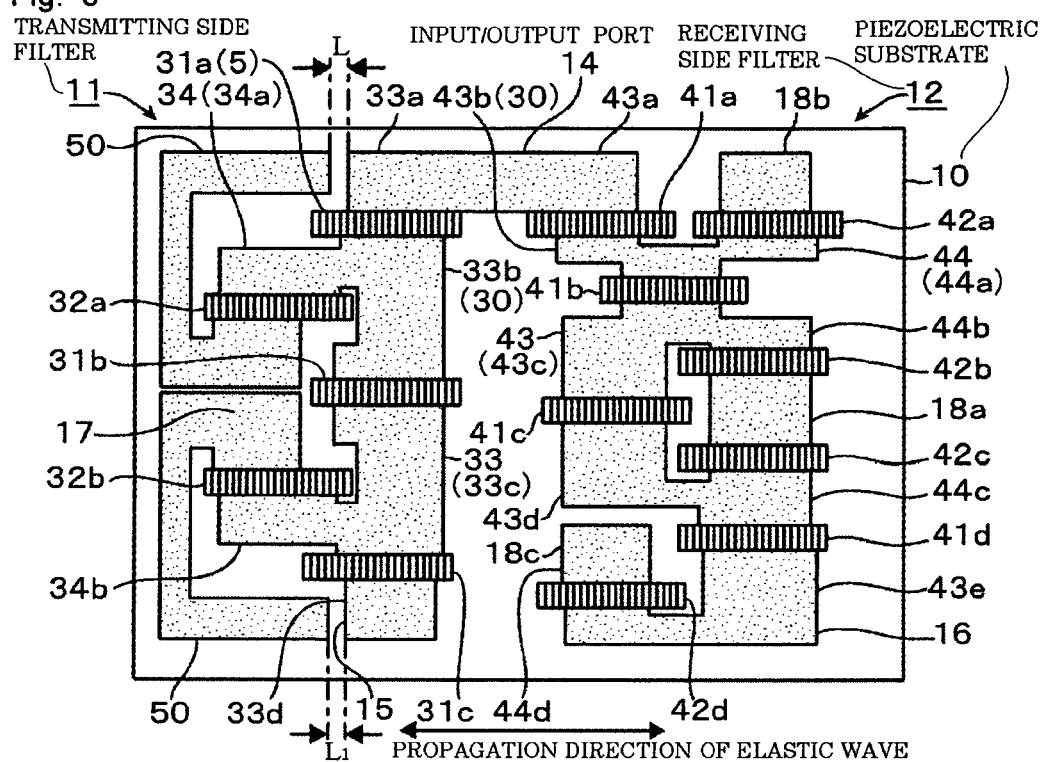
FIG. 8 is a plan view schematically showing an another example of the aforementioned duplexer.

In the above-described respective examples, the parallel signal paths 34a, 34b between the parallel arms 32a and 32b are mutually connected to dispose the common first ground electrode 17, but, it is also possible to separately provide the first ground electrode 17 for each of the parallel arms 32a, 32b. In such a case, it is also possible that two first shield electrodes 50, 50 are disposed so as to extend from two first ground electrodes 17, 17 to the input/output port 14 and the transmission input port 15, respectively, as shown in FIG. 8, and that the first shield electrode 50 is disposed so as to extend from either of the first ground electrodes 17 to at least either of the input/output port 14 and the transmission input port 15.

Figure 9:
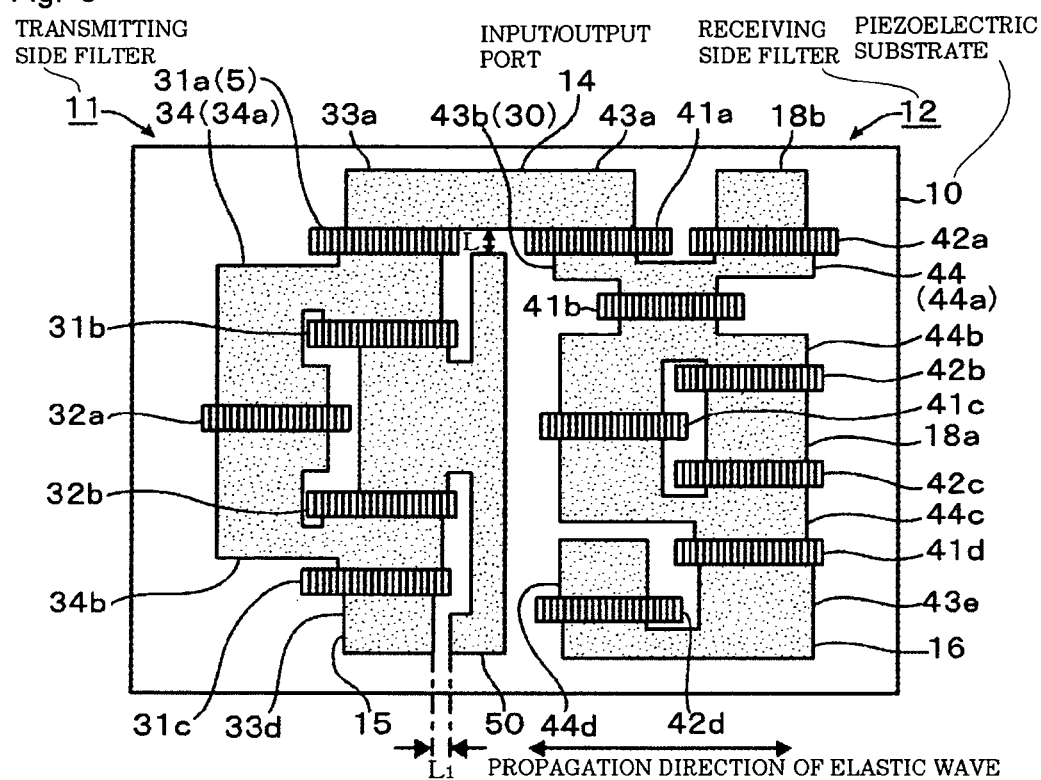
FIG. 9 is a plan view schematically showing an another example of the aforementioned duplexer.

Further, although the serial signal paths 33 of the transmitting side filter 11 are disposed close to the receiving side filter 12, it is also possible to dispose the parallel arms 32 close to the receiving side filter 12, as shown in FIG. 9. In this case, the first shield electrode 50 is disposed in an area between the filters 11 and 12. Further, in FIG. 9, the first shield electrode 50 is disposed close to both the input/output port 14 and the transmission input port 15, and the aforementioned separation sizes L, L1 are set to, for instance, 10 to 100 μm, and 10 to 100 μm, respectively. Therefore, in this example, not only the capacitive couplings C1 to C3 but also the capacitive couplings C10 to C21 shown in the aforementioned FIG. 22(b) can be reduced to a low level, which enables to further improve the isolation characteristic. Further, in like manner as described above, the maximum attenuation 3 can be reduced by Cg1, Cg2. Also in this example, the first shield electrode 50 may also be disposed close to either of the input/output port 14 and the transmission input port 15.

Further, in the above examples, the first shield electrode 50 is connected to the first ground electrode 17, but, for example, it is also possible to directly connect the electrode to a ground port provided on the module substrate (either of which is not shown) on which the piezoelectric substrate 10 is disposed by using, for instance, bonding wires or the like. In such a case, it is also possible to separate the first shield electrode 50 from the first ground electrode 17, and to dispose the electrode on the forward side or the rearward side of the piezoelectric substrate 10 so that it is close to at least either of the input/output port 14 and the transmission input port 15.

Figure 10:
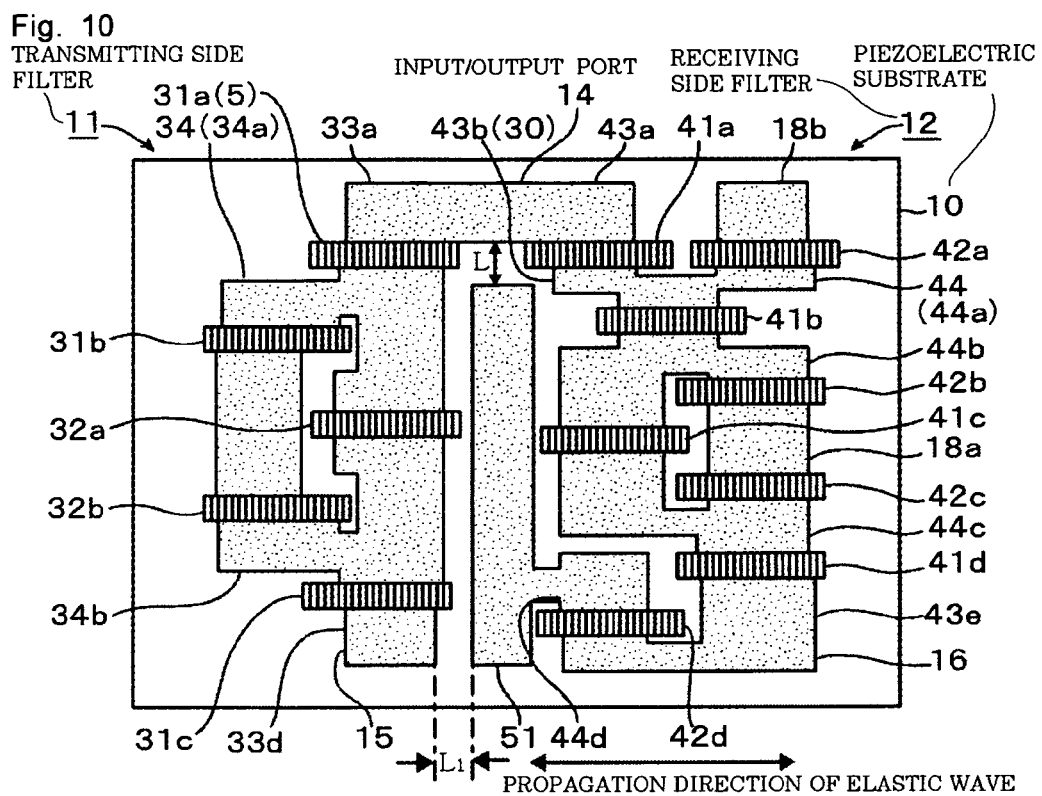
FIG. 10 is a plan view schematically showing an another example of the aforementioned duplexer.

Further, as shown in FIG. 10, it is also possible to dispose a second shield electrode 51 in an area between the transmitting side filter 11 and the receiving side filter 12 so as to extend from a ground electrode 18c of the receiving side filter 12 to at least either of the input/output port 14 and the transmission input port 15. In this example, the second shield electrode 51 is disposed close to both the input/output port 14 and the transmission input port 15, and the aforementioned separation sizes L, L1 are set to, for instance, 10 to 100 μm, and 10 to 100 μm, respectively. Also in this case, the aforementioned capacitive couplings C1 to C21 can be reduced to a low level, so that the isolation characteristic on the high band side is improved and the maximum attenuation 3 is shifted to the low band side. In this case, the second shield electrode 51 may also be connected to at least one of ground electrodes 18a to 18c, or may also be directly connected to a ground port provided on the module substrate, in the same manner as the first shield electrode 50. Further, when the second shield electrode 51 and the ground electrodes 18a to 18c are not connected, it is also possible to dispose the second shield electrode 51 close to at least either of the input/output port 14 and the transmission input port 15.

Figure 11:
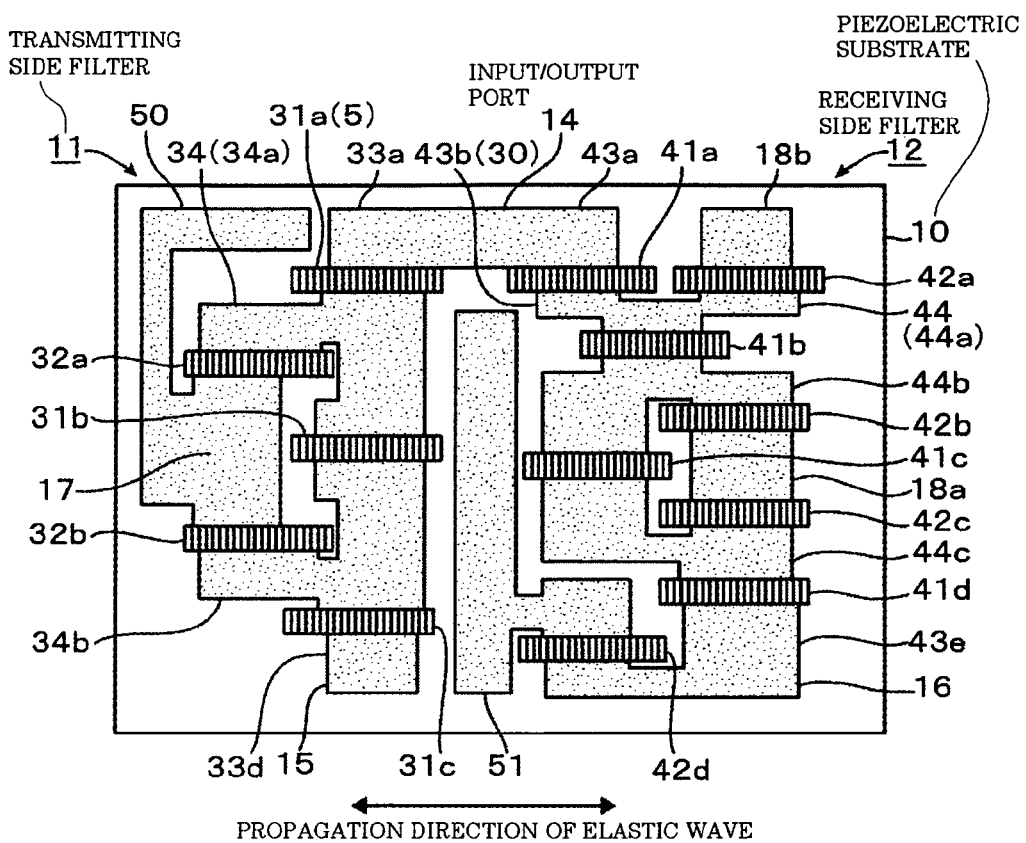
FIG. 11 is a plan view schematically showing an another example of the aforementioned duplexer.

Further, as shown in FIG. 11, it is also possible to form a duplexer by combining the transmitting side filter 11 in either of the aforementioned FIG. 1 and FIGS. 6 to 9, and the receiving side filter 12 in FIG. 10. In such a case, the isolation characteristic can be further improved, and besides, the maximum attenuation 3 can also be reduced, similarly as in the above-described case.

Figure 12:
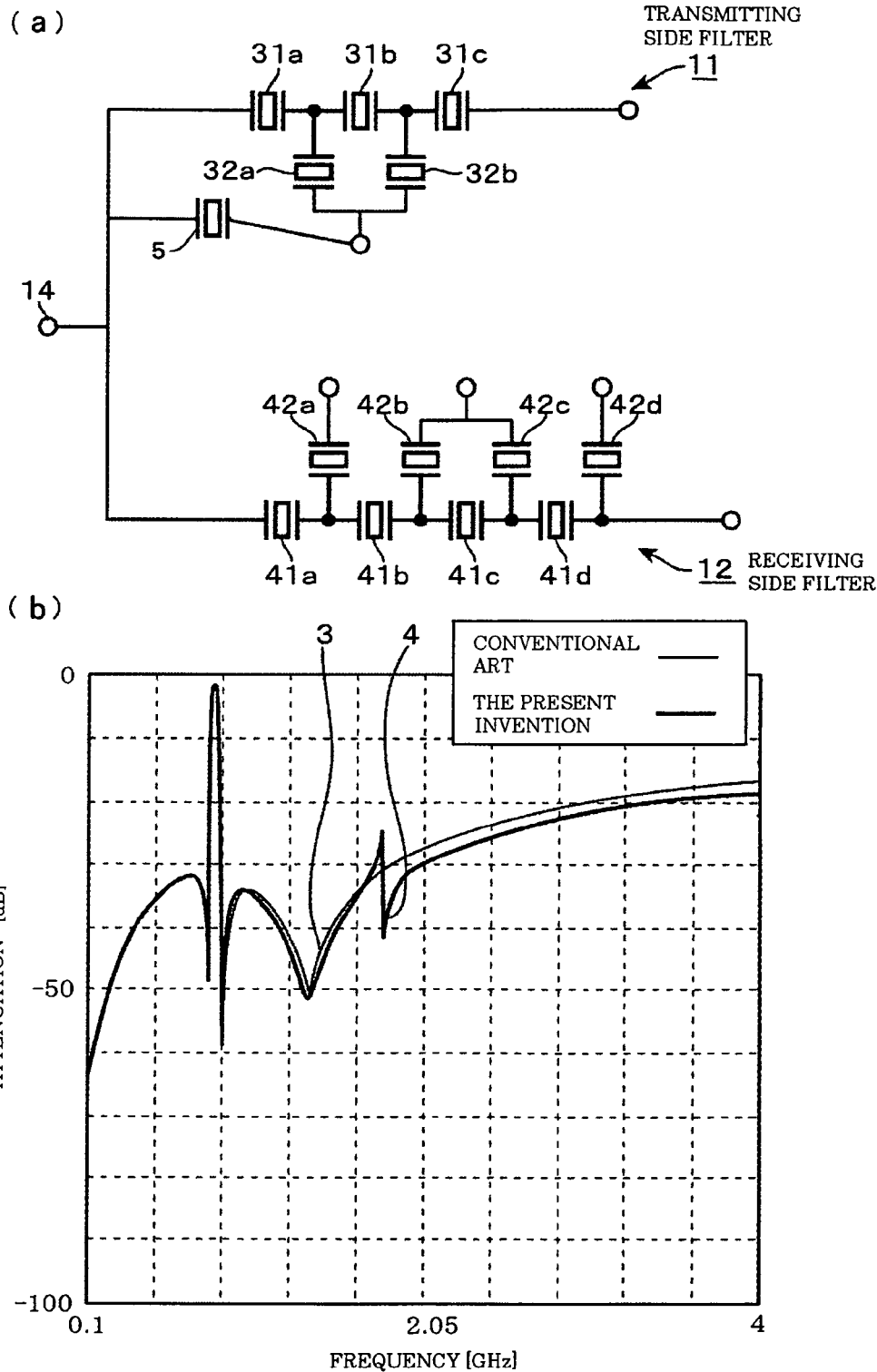
FIGS. 12(a) and 12(b) are schematic views schematically showing an another example of the aforementioned duplexer.

Further, it is also possible to interpose, in at least either of the aforementioned first shield electrode 50 and second shield electrode 51, the SAW resonator 5 at a position close to at least either of the input/output port 14 and the transmission input port 15, for instance, as shown in FIG. 12(a). In this case, as shown in FIG. 12(b), a new maximum attenuation 4 is formed on a high band side of the pass frequency band of the filters 11, 12. In this example, the SAW resonator 5 is disposed between the first shield electrode 50 and the transmission input port 15, and the maximum attenuation 4 is formed by the SAW resonator 5 at a frequency in the vicinity of 1.8 GHz. With the use of the maximum attenuation 4, it is possible to attenuate the harmonic signal level that corresponds to an integral multiple of the pass frequency band of the filters 11, 12.

Figure 13:
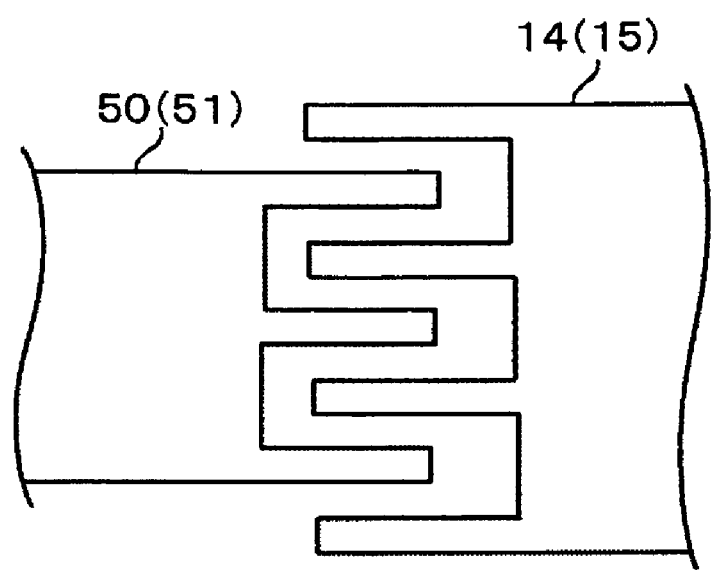
FIG. 13 is a schematic view schematically showing an another example of the aforementioned duplexer.

Further, at the time of disposing the shield electrodes 50, 51 close to at least either of the input/output port 14 and the transmission input port 15, it is also possible that end portions of the input/output port 14 (transmission input port 15) and the shield electrode 50 (51) which are facing each other, are alternately arranged to be formed in a comb-teeth shape as shown in FIG. 13, for instance, and the capacitive coupling Cg1 is formed by an interdigital capacitor. Further, when the second shield electrode 51 is disposed, it may also be disposed close to the transmission input port 15 by being extended toward the transmitting side filter 11 on the left side via an area on the forward side of the piezoelectric substrate 10, for instance. In this case, the second shield electrode 51 may also be further routed to a position close to the input/output port 14 via an area on the forward side and the left side of the transmitting side filter 11.

Further, although the filters 11, 12 are disposed on the same piezoelectric substrate 10 in the above examples, they may also be disposed on separate piezoelectric substrates 10a, 10b, respectively, as shown in the aforementioned FIG. 21(a). Further, each of the transmitting (low band) side filter 11 and the receiving (high band) side filter 12 conducts the transmission and reception of signals, but, it is also possible to form a receiving side filter and a transmitting side filter which conduct the reception of signals and the transmission of signals, respectively.

EXAMPLES

Next, an explanation will be made on simulations performed to check frequency characteristics obtained by the aforementioned shield electrode 50.

First, a simulation is performed by setting an electric circuit of a conventional duplexer as a basic circuit shown in FIG. 14(a). At this time, regarding the capacitive couplings C1 to C21 generated in the duplexer, only the capacitive coupling C1 that is considered to be largely related to the deterioration of the isolation characteristic on the high band side is used for the simulation. Further, regarding an electric circuit in the present invention, the simulation is performed by adding the capacitive coupling Cg1 to the basic circuit, as shown in FIG. 14(b). Note that a reference numeral 100 in FIG. 14 denotes an inductance component formed by electrical wirings that connect the aforementioned not-shown ground ports and the ground electrodes 17, 18.

Figure 15:
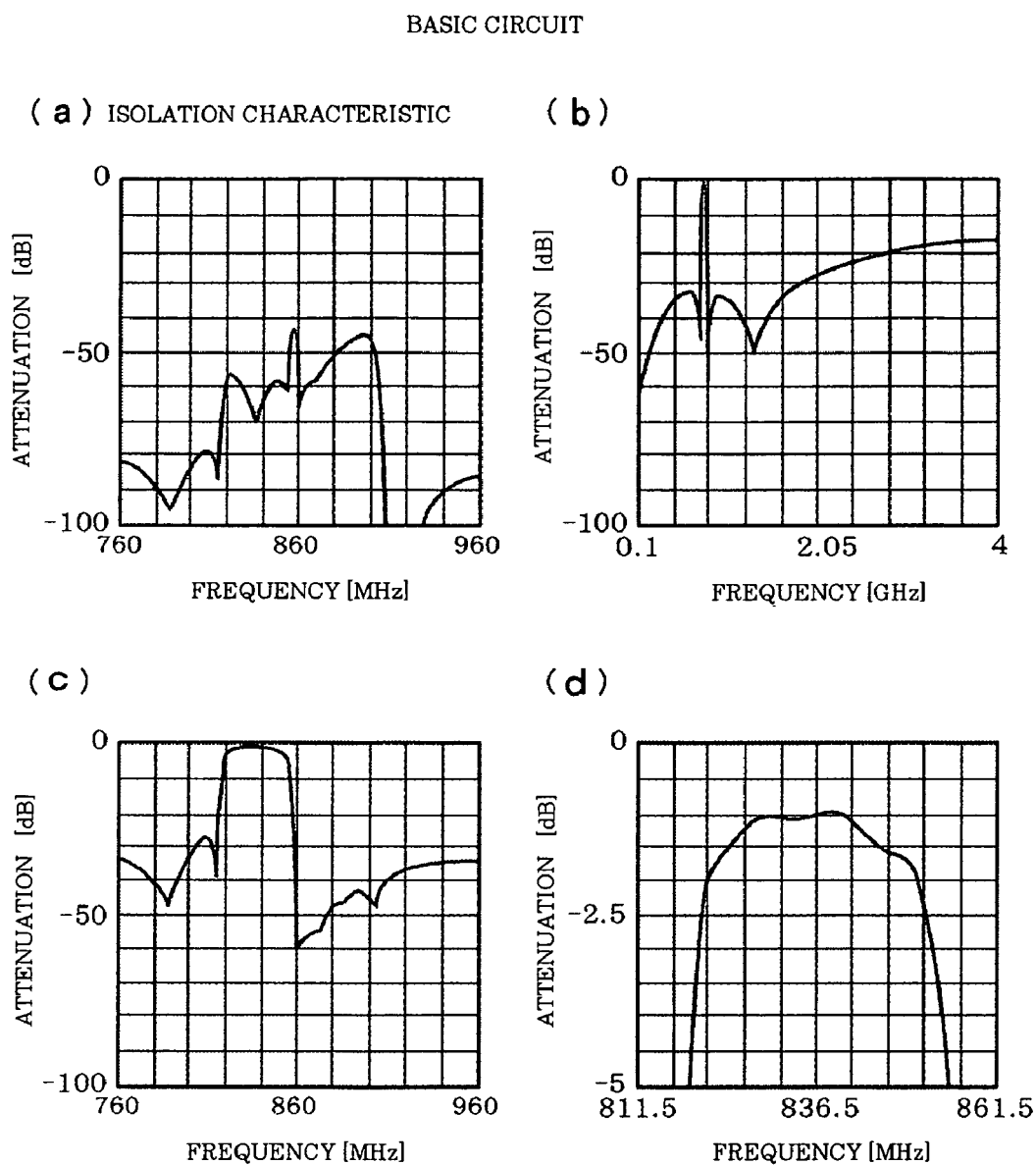
FIGS. 15(a), 15(b), 15(c) and 15(d) are characteristic diagrams showing results obtained in an example of the present invention.
Figure 16:
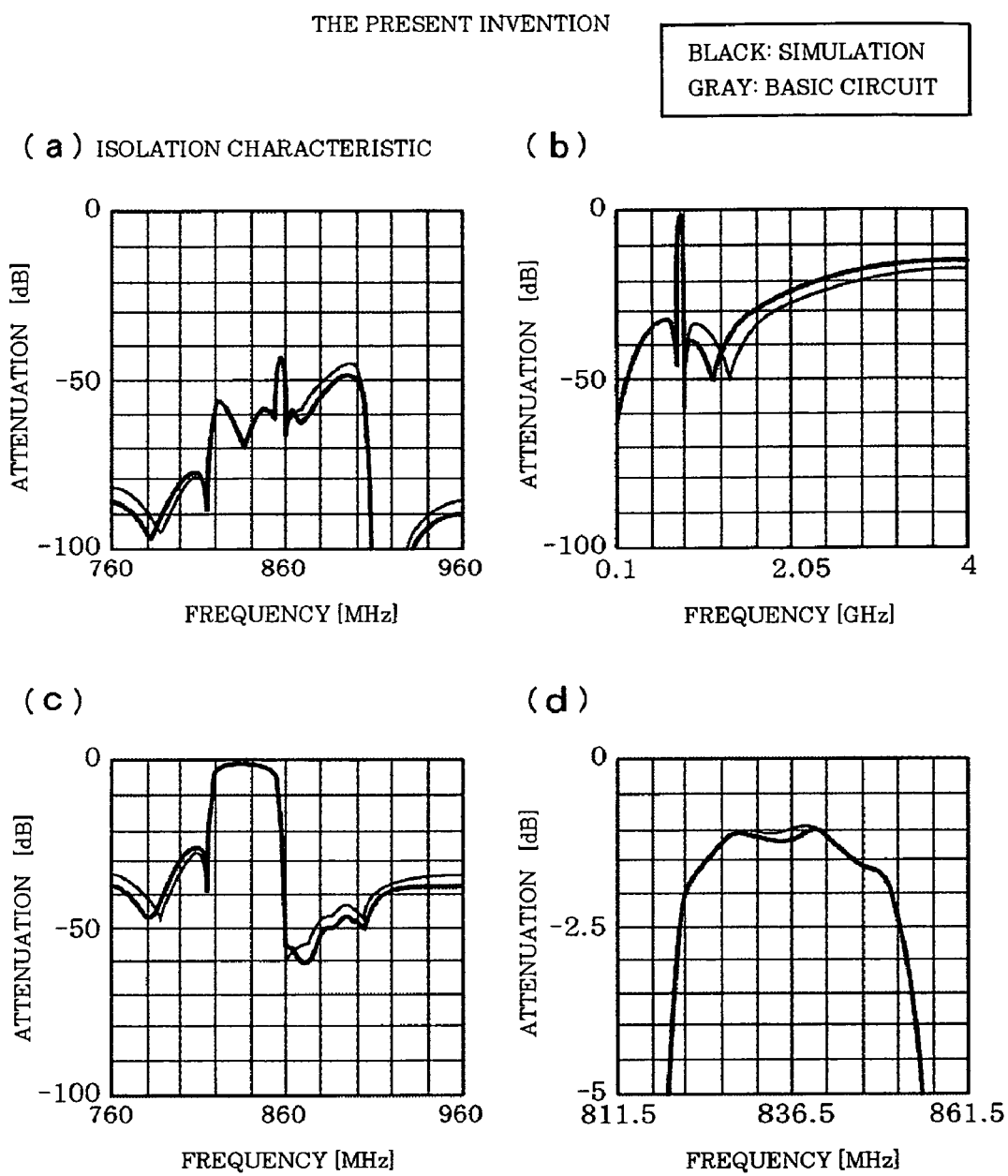
FIGS. 16(a), 16(b), 16(c) and 16(d) are characteristic diagrams showing results obtained in an example of the present invention.

The characteristics obtained in the basic circuit are shown in FIG. 15. In FIG. 15, FIG. 15(a) is a diagram showing an isolation characteristic, FIG. 15(b) is a characteristic diagram showing a frequency characteristic in a wide range (0.1 to 4 GHz) to check the maximum attenuation 3, FIG. 15(c) is a diagram showing, in an enlarged manner, a pass frequency band in FIG. 15(b), and FIG. 15(d) is a diagram showing, in an enlarged manner, an area in the pass frequency band in FIG. 15(c) in which the attenuation is in the vicinity of 0 dB. The same applies to the following FIG. 16 to FIG. 19. Further, simulation results obtained in the present invention are shown in FIG. 16. In FIG. 16, the results obtained in the basic circuit shown in FIG. 15 are indicated by gray lines (thin lines). From FIG. 16, it can be understood that is the isolation characteristic on the high band side is improved by about 3.5 dB, and the maximum attenuation 3 is shifted to the low band side by about 200 MHz in the present invention. At this time, as shown in FIG. 16(d), although the insertion loss is increased in the pass frequency band and the characteristic is deteriorated, the degree of the deterioration is confirmed to be reduced to a small level.

Figure 17:
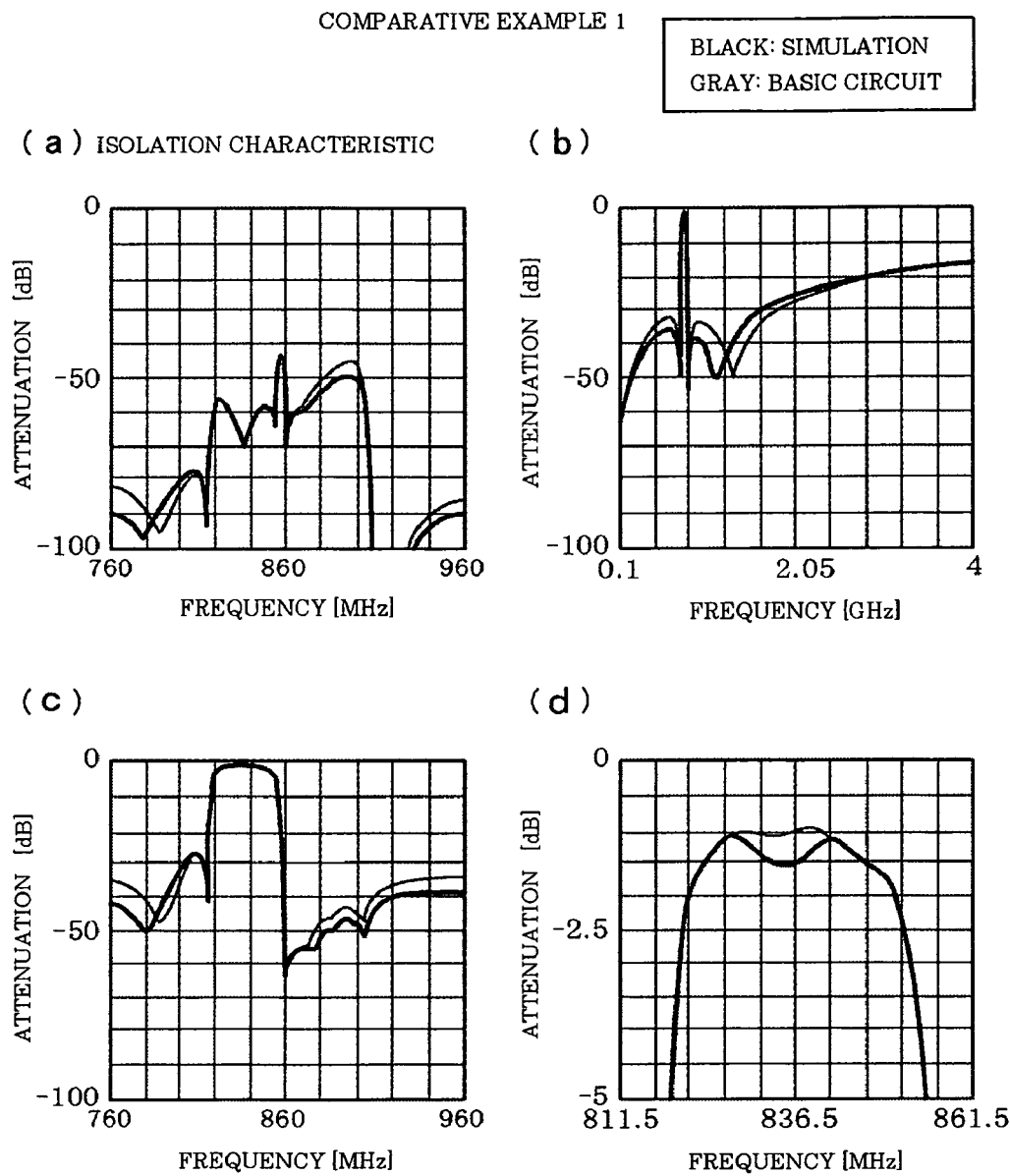
FIGS. 17(a), 17(b), 17(c) and 17(d) are characteristic diagrams showing results obtained in an example of the present invention.

Next, an explanation will be made on the simulations performed to check whether the characteristics obtained in the present invention can be obtained through a conventional method in which the shield electrode 50 is not used (the capacitive coupling Cg1 is not formed), as comparative examples 1 to 3. First, as the comparative example 1, capacitive components of the parallel arms 32 are adjusted so that the position of the maximum attenuation 3 takes the same position as that obtained in the present invention. FIG. 17 show results at this time, in which although the isolation characteristic on the high band side is nearly equal to that of the present invention, the isolation characteristic on the low band side is deteriorated by about 0.35 dB, compared with the present invention. Further, as shown in FIG. 17(d), the insertion loss in the pass frequency band becomes large. Note that also in FIG. 17, the characteristics obtained in the basic circuit shown in FIG. 15 are indicated by gray lines. The same applies to the following FIG. 18 and FIG. 19.

Figure 18:
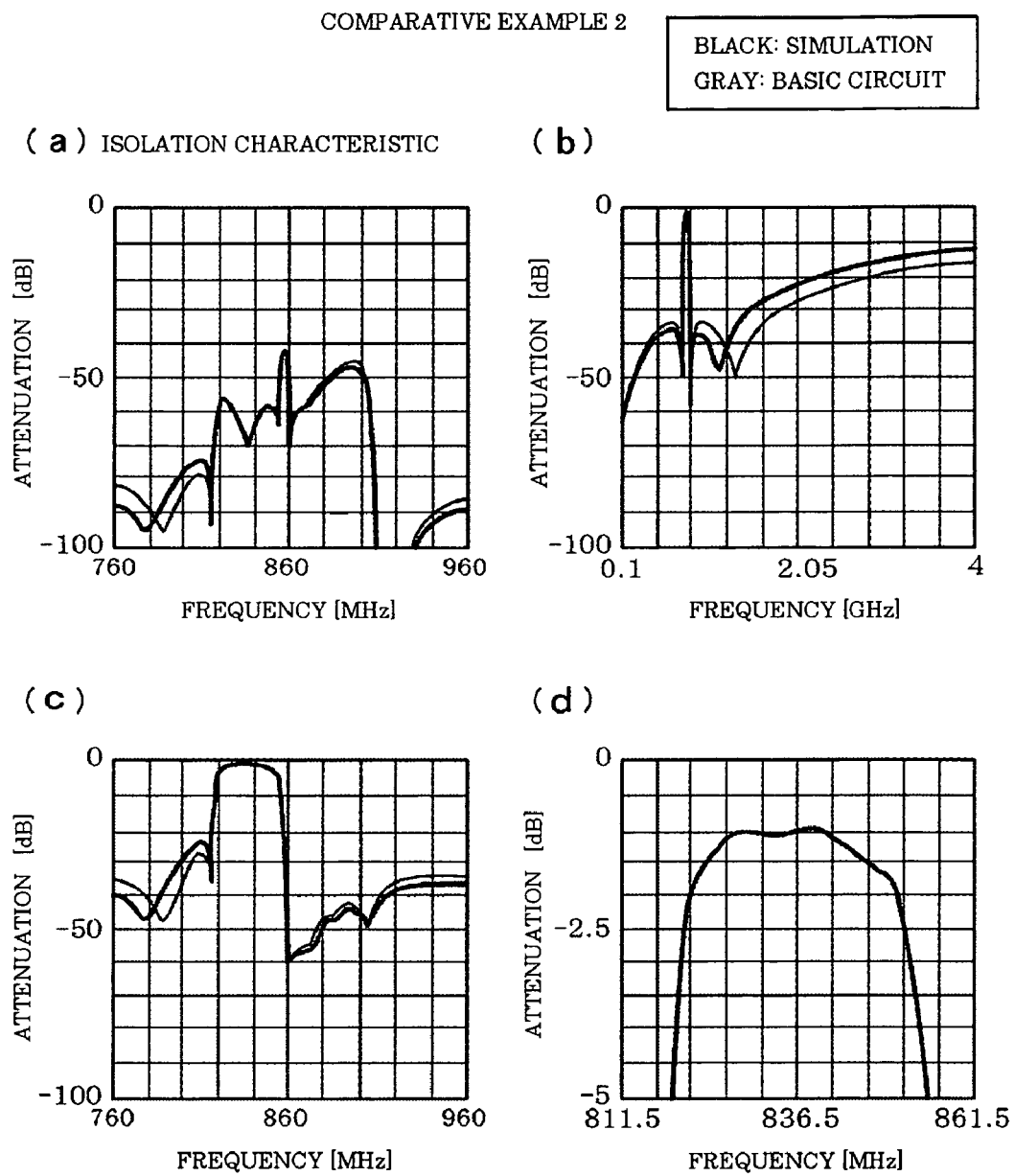
FIGS. 18(a), 18(b), 18(c) and 18(d) are characteristic diagrams showing results obtained in an example of the present invention.

Next, as the comparative example 2, an inductance component of the wiring connected to the ground electrode 17 is adjusted so that the position of the maximum attenuation 3 similarly takes the same position as that obtained in the present invention. The results are shown in FIG. 18, in to which the isolation characteristic on the high band side is deteriorated by about 1.6 dB, compared with the present invention.

Figure 19:
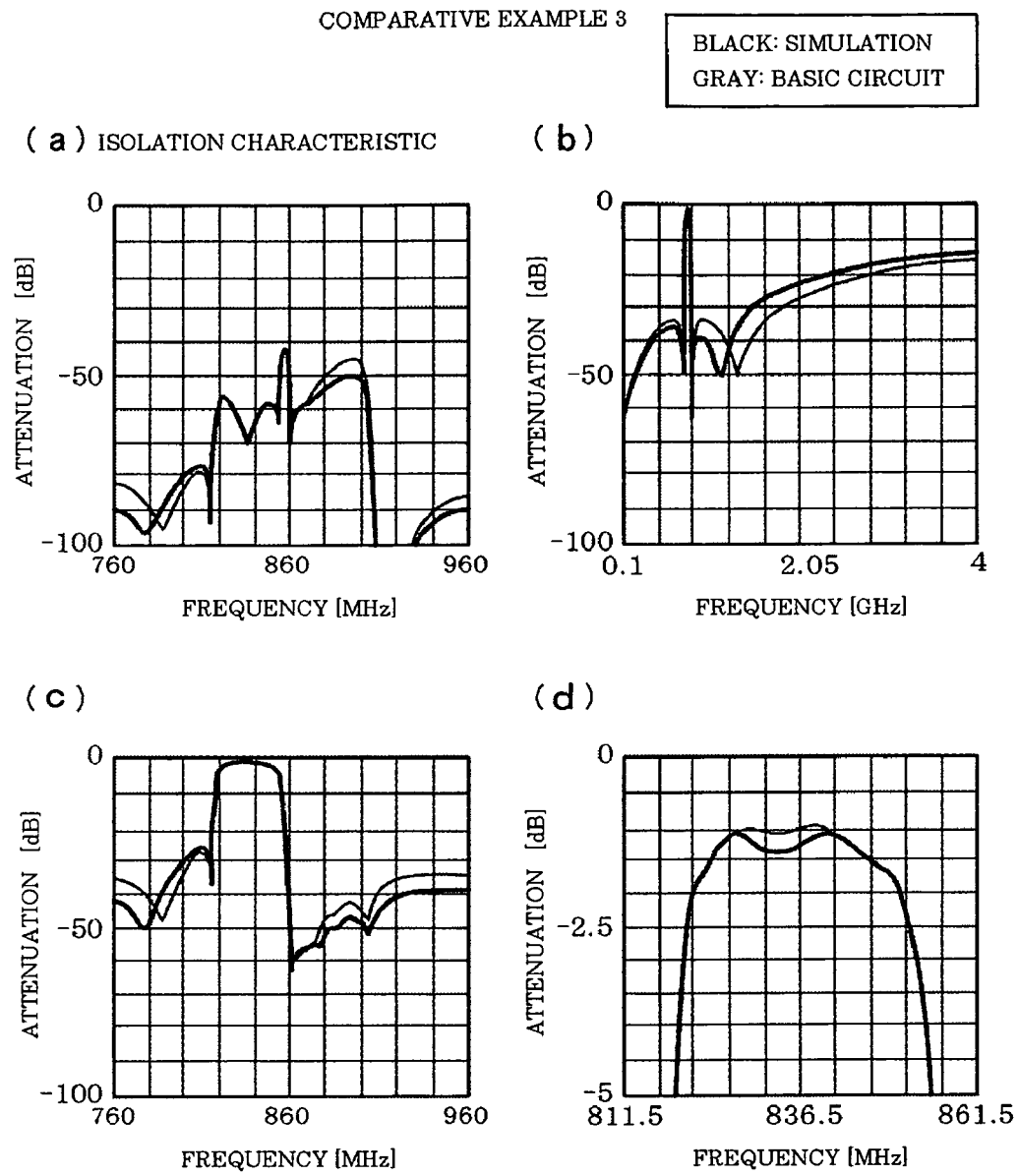
FIGS. 19(a), 19(b), 19(c) and 19(d) are characteristic diagrams showing results obtained in an example of the present invention.
Figure 20:
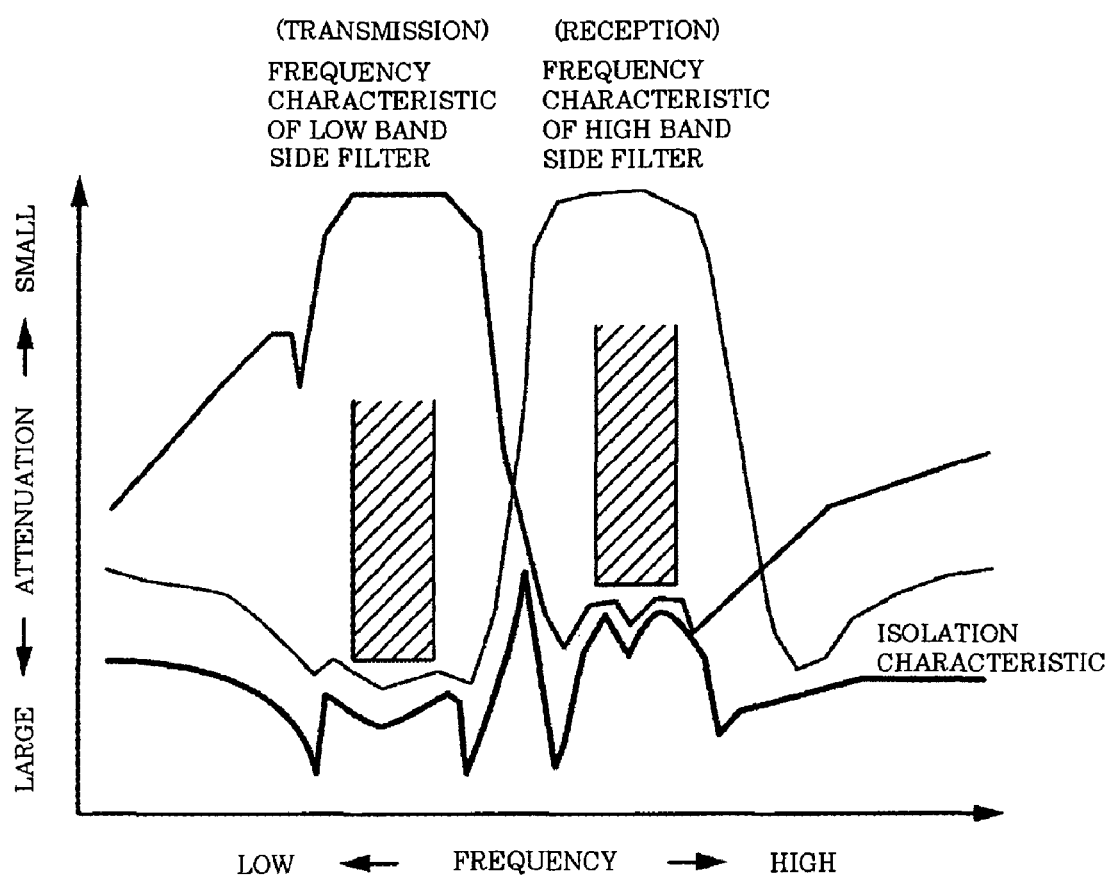
FIG. 20 is a characteristic diagram schematically showing a frequency characteristic of a duplexer.

Further, as the comparative example 3, adjustment is conducted so that the isolation characteristic on the high band side becomes nearly equal to that in the present invention by setting the position of the maximum attenuation 3 to be the same as that of the present invention in the same manner as in the comparative example 2, and by adjusting the capacitive components in the series arms 31. As a result of this, the isolation characteristic on the low band side is deteriorated by about 0.2 dB, as shown in FIG. 19. Further, the insertion loss in the pass frequency band becomes large.

From the above results, it can be confirmed that according to the present invention, it is possible to improve the isolation characteristic on the high band side while reducing the deterioration (increase) of the insertion loss, and to shift the position of the maximum attenuation 3 to the low band side. It can be considered that this is because the capacitive coupling C1 that largely affects the deterioration of the isolation characteristic on the high band side is decreased by the capacitive coupling Cg1.

It has already been described that the longitudinal mode resonator type filter that converts unbalanced signals into balanced signals may also be used as the aforementioned receiving side filter 12, and a concrete structure of the receiving side filter 12 in this case will be described with reference to FIG. 24. This example shows the receiving side filter 12 in which the aforementioned ladder-type filter is combined with the longitudinal mode resonator type filter, and as the transmitting side filter 11, the ladder-type filter in FIG. 1 is disposed. Note that in FIG. 24, portions with the same structure as in the aforementioned FIG. 1 are denoted by the same reference numerals and an explanation thereof will be omitted. Further, in FIG. 24, the aforementioned SAW resonator 5 is illustrated as an IDT electrode 5a and reflectors 5b, 5b disposed on both sides of the IDT electrode 5a in the propagation direction of the elastic wave.

Figure 24:
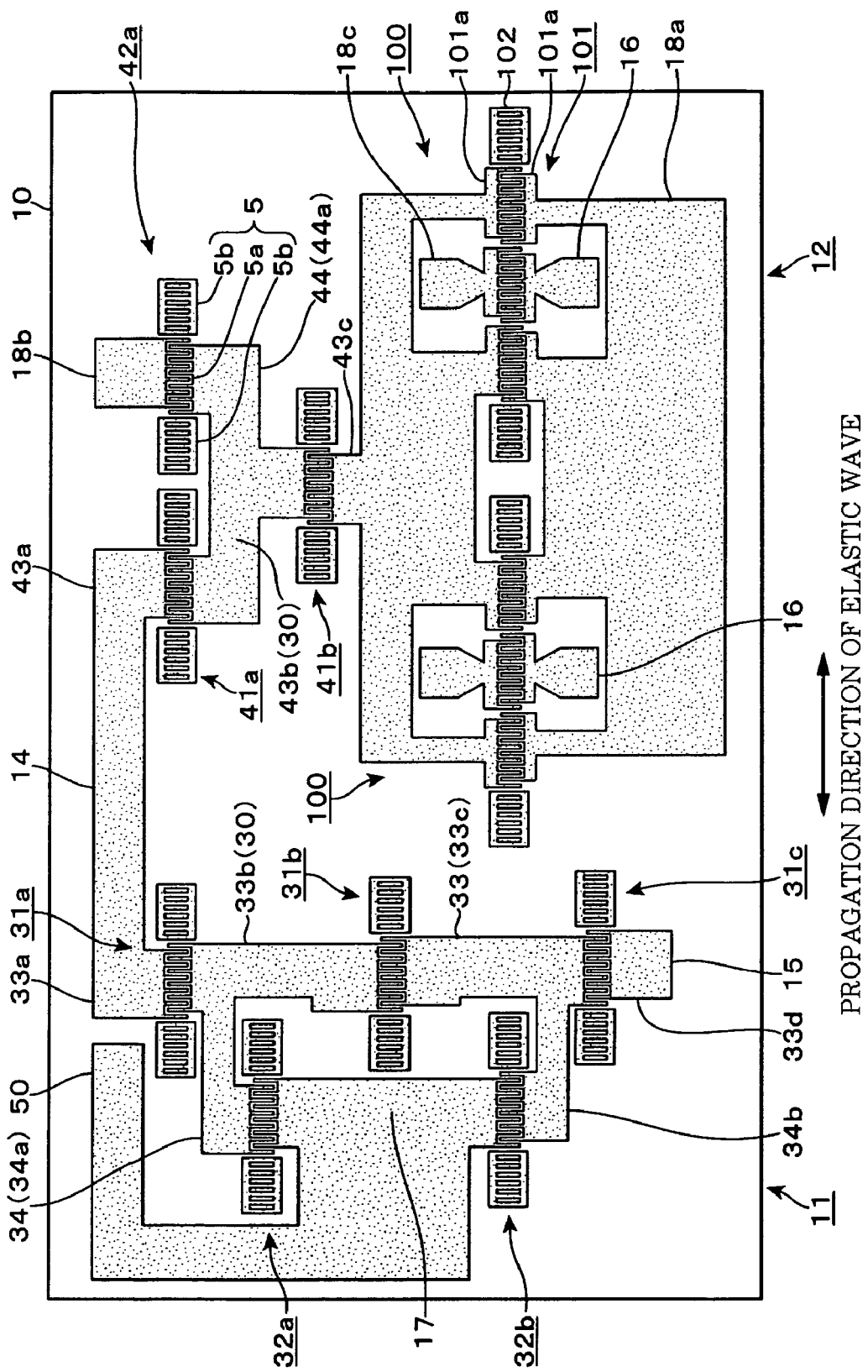
FIG. 24 is a schematic view showing an another example of the duplexer of the present invention.

In the receiving side filter 12 in FIG. 24, to the serial signal path 43c that extends to the forward side from the input/output port 14 via the series arms 41a, 41b, two longitudinal mode resonator type filters 100, 100 are connected in parallel. Specifically, each of these longitudinal mode resonator type filters 100, 100 is provided with three IDT electrodes 101 lined along the propagation direction of the elastic wave, and reflectors 102, 102 disposed to sandwich the three IDT electrodes 101 from both sides. The aforementioned serial signal path 43c is connected to each of rearward-side bus bars 101a of the IDT electrodes 101 positioned on both end sides of the respective longitudinal mode resonator type filters 100, 100.

Further, forward-side bus bars 101a of the IDT electrodes 101 positioned on the both end sides of these longitudinal mode resonator type filters 100, 100 are mutually connected to form a ground electrode 18a. Further, to rearward-side bus bars 101a and forward-side bus bars 101a of the IDT electrodes 101, 101 positioned on the center side of the respective longitudinal mode resonator type filters 100, 100, the ground electrodes 18c, 18c, and the reception output ports 16, 16 are respectively connected. These ground electrodes 18a, 18c are respectively connected to ground ports formed on the module substrate (either of which is not shown) via bonding wires, bumps, or the like. The aforementioned serial signal path 43c and the ground electrode 18a are disposed to be separated from the ground electrodes 18c, the reception output ports 16 and the reflectors 102.

In the receiving side filter 12, signals are balanced-output from the input/output port 14 to the not-shown reception processing part via the reception output ports 16, 16. Also in the case of using the receiving side filter 12 with such a structure, the capacitive couplings C1 to C3 are reduced and the position of the maximum attenuation 3 can be shifted to the low band side, similar to the aforementioned examples.

Figure 25:
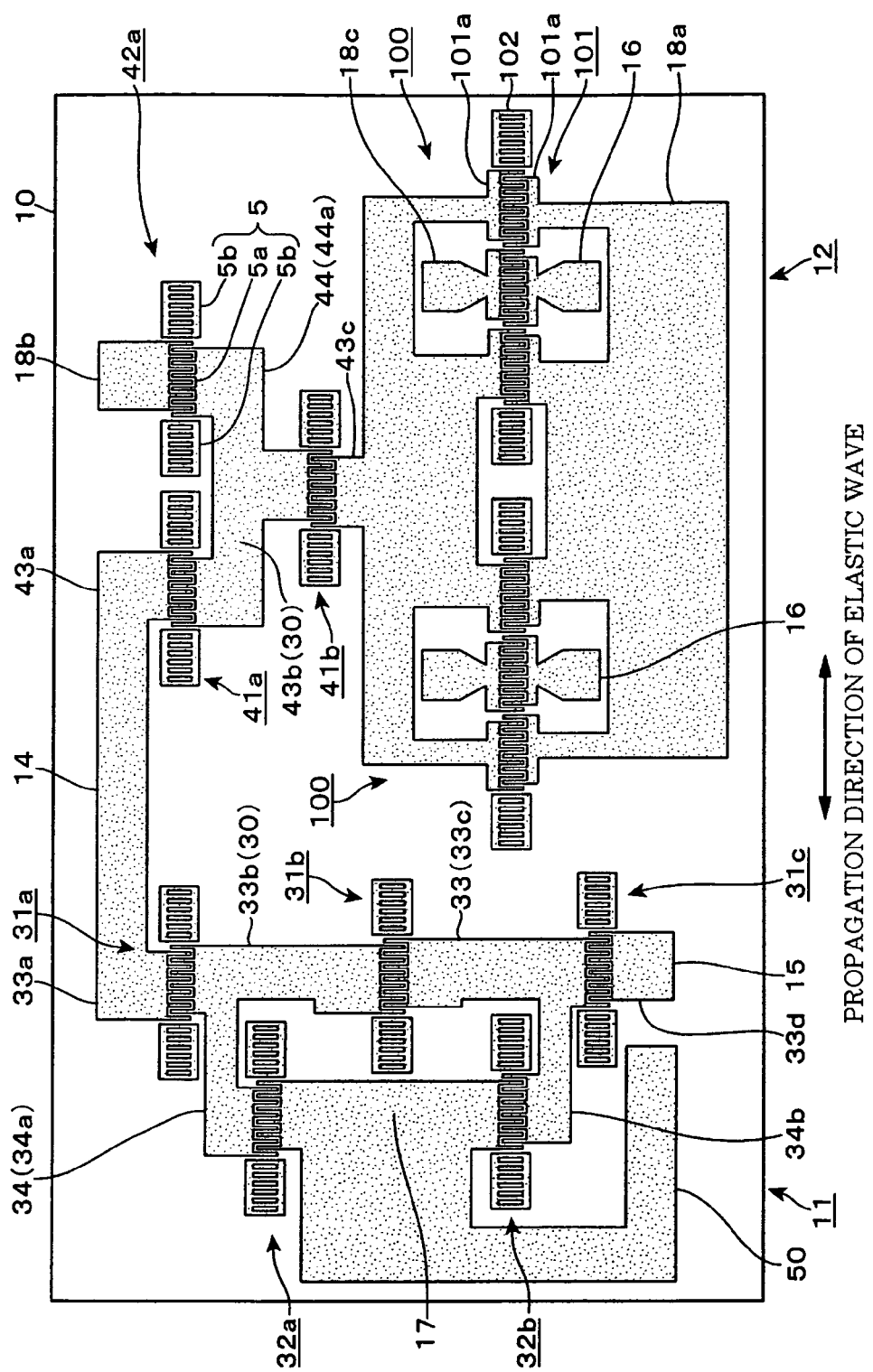
FIG. 25 is a schematic view showing an another example of the duplexer of the present invention.

Also in the case of using the longitudinal mode resonator type filter 100, the first shield electrode 50 may also be disposed as shown in FIG. 6 to FIG. 9, for example. FIG. 25 shows an example in which the first shield electrode 50 is closely disposed toward the transmission input port 15 from the first ground electrode 17, similar to FIG. 6.

Figure 26:
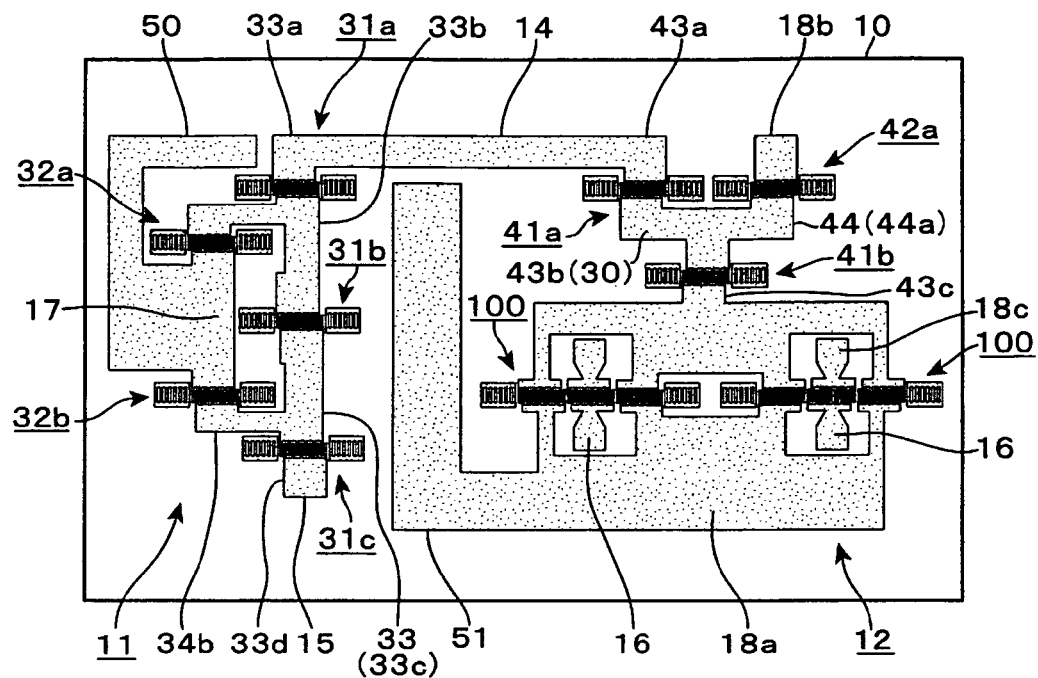
FIG. 26 is a schematic view showing an another example of the duplexer of the present invention.
Figure 27:
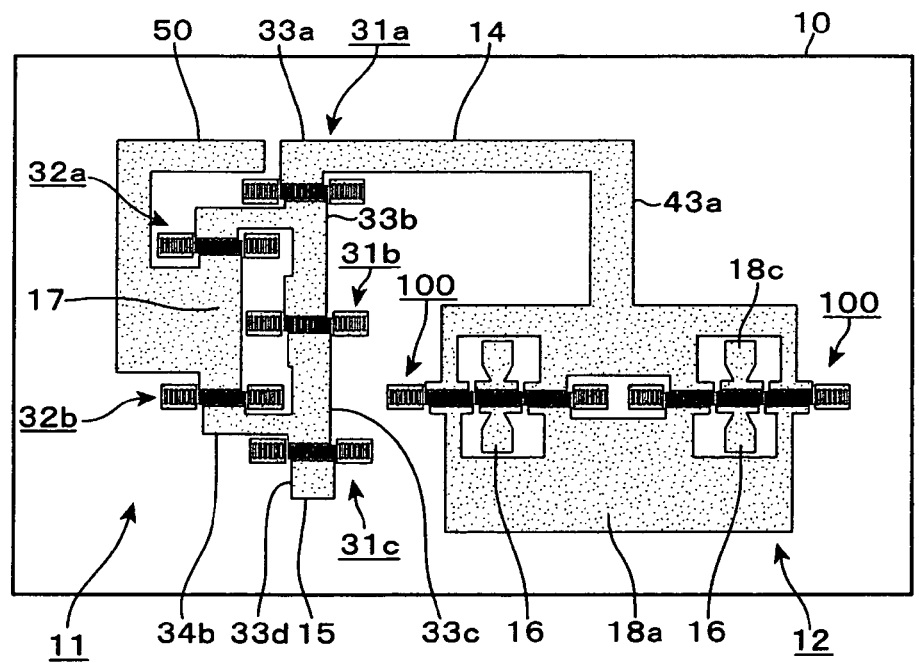
FIG. 27 is a schematic view showing an another example of the duplexer of the present invention.
Figure 28:
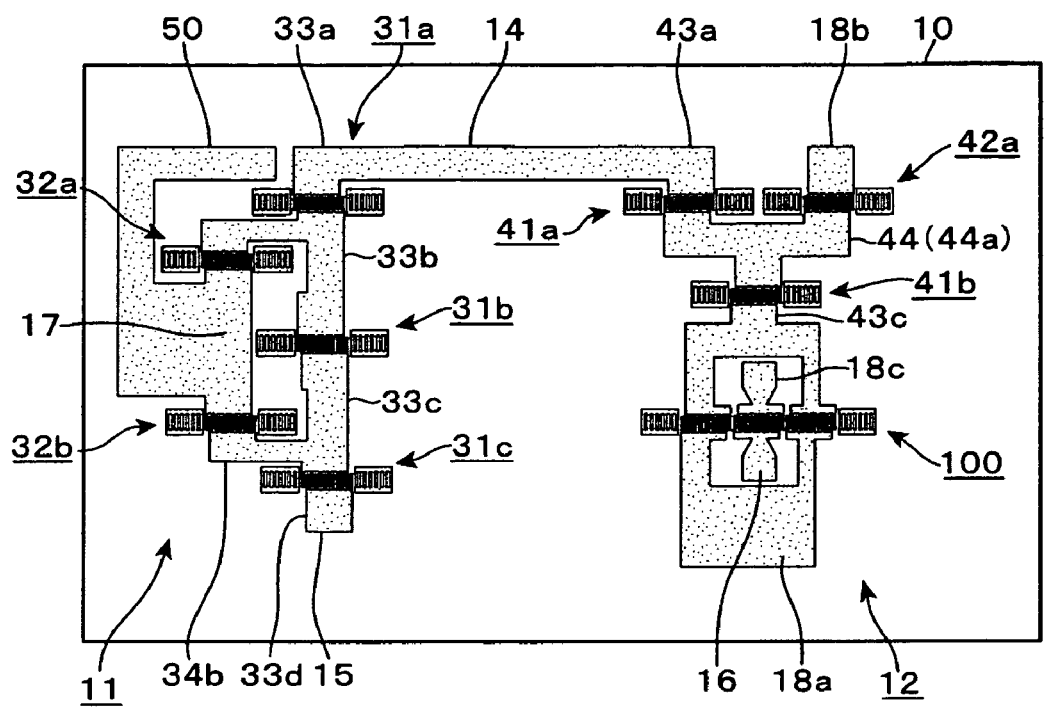
FIG. 28 is a schematic view showing an another example of the duplexer of the present invention.

Further, as shown in FIG. 26, for instance, it is also possible to dispose the second shield electrode 51 extending from at least one ground electrode 18 among the ground electrodes 18a, 18b, 18c of the receiving side filter 12 to at least either of the input/output port 14 and the transmission input port 15, as described above. Further, although the ladder-type filter (series arms 41a, 41b, and the parallel arm 42a) is interposed between the input/output port 14 and the longitudinal mode resonator type filter 100, it is also possible to directly connect the input/output port 14 and the longitudinal mode resonator type filter 100 as shown in FIG. 27. Furthermore, when using the longitudinal mode resonator type filter 100, the receiving side filter 12 is structured to realize the balanced output by disposing two longitudinal mode resonator type filters 100 and two reception output ports 16, but, as shown in FIG. 28, it is also possible to dispose one longitudinal mode resonator type filter 100 and one reception output port 16 to realize an unbalanced output.

What is claimed is:

1. A low band side filter being a low band side filter in a duplexer formed on a piezoelectric substrate and in which transmission and reception of signals are respectively performed from either of said low band side filter and a high band side filter and the other filter with respect to an input/output port, said low band side filter, comprising:

elastic wave resonators provided between the input/output port and a low band side filter port through which either the transmission or the reception of signals is performed with respect to the input/output port; and a first shield electrode closely disposed to at least one port of the input/output port and the low band side filter port and grounded to form a capacitive coupling between said first shield electrode and either of the ports, wherein a gap between said first shield electrode and the one port is 10 µm to 100 µm.

2. The low band side filter according to claim 1, wherein said first shield electrode is disposed in an area between said low band side filter and the high band side filter.

3. The low band side filter according to claim 1, wherein said first shield electrode is connected to a first ground electrode provided in said low band side filter.

4. The low band side filter according to claim 1, wherein said first shield electrode has an elastic wave resonator interposed therein.

5. The low band side filter according to claim 1, wherein said low band side filter is a transmitting side filter having elastic wave resonators that form series arms and elastic wave resonators that form parallel arms.

6. A high band side filter being a high band side filter in a duplexer formed on a piezoelectric substrate and in which transmission and reception of signals are respectively performed from either of a low band side filter and said high band side filter and the other filter with respect to an input/output port, said high band side filter, comprising:

elastic wave resonators provided between the input/output port and a high band side filter port through which either the transmission or the reception of signals is performed with respect to the input/output port; and a second shield electrode formed on an area opposite to the low band side filter, closely disposed to at least one port of the input/output port and a low band side filter port of the low band side filter and grounded to form a capacitive coupling between said second shield electrode and either of the ports, wherein a gap between said second shield electrode and the one port is 10 µm to 100 µm.

7. The high band side filter according to claim 6, wherein said second shield electrode is connected to a second ground electrode provided in said high band side filter.

8. The high band side filter according to claim 6, wherein said second shield electrode has an elastic wave resonator interposed therein.

9. The high band side filter according to claim 6, wherein said high band side filter is a receiving side filter having either of a filter having elastic wave resonators that form series arms and elastic wave resonators that form parallel arms, and a longitudinal mode resonator type filter.

10. A duplexer having a low band side filter and a high band side filter each formed on a piezoelectric substrate and in which transmission and reception of signals are respectively performed from either of the low band side filter and the high band side filter and the other filter with respect to an input/output port, said duplexer comprising:

at least one of said low band side filter according to claim 1 and said high band side filter according to claim 6.

11. The duplexer according to claim 10, wherein said low band side filter and said high band side filter are formed on the same piezoelectric substrate.

12. The low band side filter according to claim 1, wherein said first shield electrode is disposed between the input/output port and the low band side filter port to form a capacitive coupling between the input/output port and the low band side filter port, wherein a gap between the input/output port and the low band side filter port is 10 µm to 100 µm.

13. The high band side filter according to claim 6, wherein a first shield electrode is closely disposed to an area between the input/output port and the low band side filter port to form a capacitive coupling between the input/output port and the low band side filter port, wherein a gap between said input/output port and the low band side filter port is 10 µm to 100 µm.

14. The low band side filter according to claim 4, wherein said low band side filter is a transmitting side filter having elastic wave resonators that form series arms and elastic wave resonators that form parallel arms.

15. The high band side filter according to claim 8, wherein said high band side filter is a receiving side filter having either of a filter having elastic wave resonators that form series arms and elastic wave resonators that form parallel arms, and a longitudinal mode resonator type filter.

* * * * *